(12) United States Patent
Smith et al.

(10) Patent No.: US 6,388,226 B1
(45) Date of Patent: May 14, 2002

(54) TOROIDAL LOW-FIELD REACTIVE GAS SOURCE

(75) Inventors: Donald K. Smith, Belmont; Xing Chen, Lexington; William M. Holber, Winchester; Eric Georgelis, Canton, all of MA (US)

(73) Assignee: Applied Science and Technology, Inc., Wilmington, DE (US)

( * ) Notice: Subject to any disclaimer, the term of this patent is extended or adjusted under 35 U.S.C. 154(b) by 0 days.

(21) Appl. No.: 09/502,087

(22) Filed: Feb. 10, 2000

Related U.S. Application Data

(63) Continuation-in-part of application No. 08/883,281, filed on Jun. 26, 1997.
(60) Provisional application No. 60/119,635, filed on Feb. 11, 1999.

(51) Int. Cl.[7] ............................................. B23K 10/00
(52) U.S. Cl. .......................... 219/121.57; 219/121.54; 219/121.43; 219/121.59; 156/345; 315/111.51
(58) Field of Search .................. 219/121.54, 121.57, 219/121.43, 121.59; 156/345, 646.1; 315/111.51; 204/298.31

(56) References Cited

U.S. PATENT DOCUMENTS

| 3,343,022 A | 9/1967 | Eckert ........................ 313/63 |
| 3,500,118 A | 3/1970 | Anderson |
| 3,663,361 A | 5/1972 | Yoshikawa |
| 3,987,334 A | 10/1976 | Anderson |
| 4,065,369 A | 12/1977 | Ogawa et al. |
| 4,088,926 A | 5/1978 | Fletcher et al. |
| 4,180,763 A | 12/1979 | Anderson |
| 4,252,609 A | 2/1981 | Kerst et al. |
| 4,285,800 A | 8/1981 | Welty |
| 4,324,611 A | 4/1982 | Vogel et al. |
| 4,350,578 A | 9/1982 | Frieser et al. |
| 4,368,092 A | 1/1983 | Steinberg et al. |
| 4,431,898 A | 2/1984 | Reinberg et al. |

(List continued on next page.)

FOREIGN PATENT DOCUMENTS

| JP | 61-139029 | 6/1986 | |
| JP | 02260399 | 10/1990 | ............ H05H/1/46 |
| JP | 5-144594 | 6/1993 | |
| JP | 5-166595 | 7/1993 | |
| SU | 957744 A1 | 2/1996 | |
| WO | WO90/10945 | 9/1990 | ............ H01J/27/16 |

OTHER PUBLICATIONS

S.V. Dresvin, Physics & Tech. of Low Temp. Plasmas, H. Eckert ed, p. 234 (1977).
H.U. Eckert, "Analysis of Thermal Induction Plasmas between Coaxial Cylinders" *J. Appl. Phys.* 43(1):46–52 (1972).

(List continued on next page.)

*Primary Examiner*—Mark Paschall
(74) *Attorney, Agent, or Firm*—Testa, Hurwitz & Thibeault, LLP

(57) ABSTRACT

An improved toroidal low-field plasma source allows plasma ignition within a wider range of gas conditions than permitted by prior art plasma sources. Power efficiency of the plasma source is improved by automatically adjusting the power delivered to the plasma based on the load to the power supply. The plasma source can be operated over a wider pressure range than allowed by prior art plasma sources. The plasma source can be operated so as to increase the output of atomic species from the source. The plasma source can be operated to increase the etch rate of organic materials. The plasma source can efficiently remove hazardous gas compounds from effluent gas streams by converting them into scrubbable products.

36 Claims, 17 Drawing Sheets

U.S. PATENT DOCUMENTS

| | | |
|---|---|---|
| 4,431,901 A | 2/1984 | Hull .......................... 219/121 |
| 4,461,954 A | 7/1984 | Inoue |
| 4,626,400 A | 12/1986 | Jassby et al. |
| 4,631,105 A | 12/1986 | Carroll et al. |
| 4,668,366 A | 5/1987 | Zarowin |
| 4,668,336 A | 6/1987 | Shimkunas |
| 4,689,192 A | 8/1987 | Nagata |
| 4,748,383 A | 5/1988 | Houkes |
| 4,786,352 A | 11/1988 | Benzing |
| H554 H | 12/1988 | Dawson et al. |
| 4,793,975 A | 12/1988 | Drage |
| 4,810,933 A | 3/1989 | Moisan et al. |
| H627 H | 4/1989 | Peng |
| 4,853,250 A | 8/1989 | Boulos et al. |
| 4,859,399 A | 8/1989 | Bussard |
| 4,859,908 A | 8/1989 | Yoshida et al. |
| 4,878,149 A | 10/1989 | Stiehl et al. ................ 361/230 |
| 4,897,282 A | 1/1990 | Kniseley et al. |
| 4,906,898 A | 3/1990 | Moisan |
| 4,948,458 A | 8/1990 | Ogle |
| 5,000,771 A | 3/1991 | Fleming, Jr. et al. |
| 5,008,593 A | 4/1991 | Schlie et al. |
| 5,016,332 A | 5/1991 | Reichelderfer, deceased et al. |
| 5,030,889 A | 7/1991 | El-Hamamsy et al. |
| 5,144,196 A | 9/1992 | Gegenwart et al. |
| 5,153,484 A | 10/1992 | El-Hamamsy |
| 5,180,150 A | 1/1993 | Prusak et al. |
| 5,198,718 A | 3/1993 | Davis et al. |
| 5,200,595 A | 4/1993 | Boulos et al. |
| 5,206,516 A | 4/1993 | Keller et al. |
| 5,254,830 A | 10/1993 | Zarowin et al. |
| 5,280,154 A | 1/1994 | Cuomo et al. |
| 5,099,100 A | 3/1994 | Bersin et al. |
| 5,290,382 A | 3/1994 | Zarowin et al. ............ 156/345 |
| 5,336,355 A | 8/1994 | Zarowin et al. |
| 5,346,578 A | 9/1994 | Benzing et al. ............ 156/345 |
| 5,352,249 A | 10/1994 | Vollaro |
| 5,353,314 A | 10/1994 | Schaffer |
| 5,364,496 A | 11/1994 | Bollinger et al. |
| 5,364,600 A | 11/1994 | Stiehl et al. |
| 5,365,147 A | 11/1994 | Shinohara et al. |
| 5,372,674 A | 12/1994 | Steinberg |
| 5,394,061 A | 2/1995 | Fujii |
| 5,397,962 A | 3/1995 | Moslehi |
| 5,401,350 A | 3/1995 | Patrick et al. .............. 156/345 |
| 5,405,480 A | 4/1995 | Benzing et al. ............ 156/345 |
| 5,406,177 A | 4/1995 | Nerone |
| 5,414,238 A | 5/1995 | Steigerwald et al |
| 5,419,803 A | 5/1995 | Mumola |
| 5,430,355 A | 7/1995 | Paranjpe ................ 315/111.21 |
| 5,468,296 A | 11/1995 | Patrick et al. .............. 118/723 |
| 5,468,955 A | 11/1995 | Chen et al. |
| 5,472,561 A | 12/1995 | Williams et al. |
| 5,473,291 A | 12/1995 | Brounley |
| 5,479,072 A | 12/1995 | Dakin et al. ................ 313/638 |
| 5,506,507 A | 4/1996 | Schwierzke et al. ........ 324/464 |
| 5,514,246 A | 5/1996 | Blalock ................... 156/643.1 |
| 5,515,167 A | 5/1996 | Ledger et al. |
| 5,534,231 A | 7/1996 | Savas |
| 5,556,549 A | 9/1996 | Patrick et al. |
| 5,563,709 A | 10/1996 | Poultney |
| 5,565,036 A | 10/1996 | Westendorp et al. |
| 5,567,255 A | 10/1996 | Steinberg |
| 5,567,268 A | 10/1996 | Kadomura |
| 5,568,015 A | 10/1996 | Holber et al. |
| 5,585,766 A | 12/1996 | Shel |
| 5,610,102 A | 3/1997 | Gardopee et al. |
| 5,630,880 A | 5/1997 | Eastlund |
| 5,637,279 A | 6/1997 | Besen et al. |
| 5,639,519 A | 6/1997 | Patrick et al. |
| 5,647,913 A | 7/1997 | Blalock |
| D384,173 S | 9/1997 | Godyak et al. |
| 4,049,940 A | 9/1997 | Moisan et al. |
| 5,662,819 A | 9/1997 | Kadomura |
| 5,681,393 A | 10/1997 | Takagi |
| 5,688,415 A | 11/1997 | Bollinger et al. |
| 5,700,397 A | 12/1997 | Vollaro |
| 5,767,628 A | 6/1998 | Keller et al. |
| 5,779,849 A | 7/1998 | Blalock |
| 5,789,867 A | 8/1998 | Westendorp et al. |
| 5,798,016 A | 8/1998 | Oehrlein et al. |
| 5,811,022 A | 9/1998 | Savas et al. |
| 5,814,154 A | 9/1998 | Boitnott |
| 5,834,904 A | 11/1998 | Godyak et al. |
| 5,874,012 A | 2/1999 | Kanai et al. |
| 5,883,470 A | 3/1999 | Hatakeyama et al. |
| 5,892,198 A | 4/1999 | Barnes et al. |
| 5,914,278 A | 6/1999 | Boitnott et al. |
| 5,932,180 A | 8/1999 | Zhang et al. |
| 5,965,034 A | 10/1999 | Vinogradov et al. |
| 6,063,233 A | 5/2000 | Collins et al. |

OTHER PUBLICATIONS

H.U. Eckert, "An Electrodeless Discharge at 60Hz" *IEEE Trans. on Plasma Sci*. PS–2:308–309 (1974).

H.U. Eckert, "The Induction Arc: A State–of–the–Art Review" *High Temp. Sci.* .6:99–134 (1974).

H.U. Eckert, "Induction Plasmas at Low Frequencies" *AIAA Journal* 9(8):1452–1456 (1971).

V.M. Gol'dfarb et al., "Properties of a Low–Frequency Discharge in a Transformer Plasmatron" *Teplofizika Vysokikh Temperatur* 17(4):698–702 (1979).

E. Kandler et al., "Characterization of Plasma in an Inductively Coupled High–Dense Plasma Source" *Surface Coatings & Tech.* 74 75:539–545 (1995).

V.A. Kogan et al., "Investigation of the Prospect for the Design of Transformer–Type Plasmotrons" *Teplofizika Vysokikh Temperatur* 31(1):105–110 (1993).

R.A. Krakowski et al., "Prospects for Using Low–Frequency Induction Plasmas for Bulk–Chemical Processing: A Systems Analysis" First INEL Workshop on Plasma Applications to Waste Treatment, Idaho Fall, Idaho, Jan. 16–17, 1991.

G. Soucy et al., "Parametric Study of the Decomposition of $NH_3$ for an Induction Plasma Reactor Design" *Plasma Chem. and Plasma Proc.* 15(4):693–710 (1995).

T.B. Reed, "Induction–Coupled Plasma Torch" *J. Appl. Phys.* 32(5):821–824 (1961).

T.B. Reed, "Growth of Refractory Crystals Using the Induction Plasma Torch" *J. Appl. Phys.* 32(12)2534–2535 (1961).

T.B. Reed, "Heat–Transfer Intensity from Induction Plasma Flames and Oxy–Hydrogen Flames" J. Appl. Phys. 34(8)2266–2269 (1963).

T.B. Reed. "High–Power Low–Density Induction Plasmas" *Communications* 3146–3147 (1963).

F. Maier, "Electronic Circuits for the Generation and Transfer of High–Power Pulses in Nuclear Fusion Installations" *IEEE Transactions on Plasma Science* PS–12(3): 191–198 (1984).

International Search Report dated Nov. 5, 1998 in corresponding PCT Application No. PCT/US98/13155.

Osram Endura 150W Product Information Brochure, Nov. 1996, pp. 1–4.

Zhang et al., "A High Power Radio Frequency Transformer for Plasma Production in a Toroidal Plasma Source, " *Rev. Sci. Instrum.*, vol. 69 (Jan. 1998) pp. 101–108.

Hiramatsu et al., "Generation of Strongly Ionized Aluminum Plasma in a Low–Temperature Tokamak Discharge," *Japanese Journal of Applied Physics*, vol. 31 (Jul. 1992) pp. 2243–2248.

Hirose et al., "STOR II A Tokamak for Plasma Heating Studies," Plasma Physics Laboratory, University of Saskatchewan, Apr. 1981, pp. 11–14.

Osram ECG–SPOT Brochure, Feb. 1997, pp. 1–12.

Cayless et al., "*Lamps and Lighting*," Third Edition, pp. 280–286.

"International Lighting Review, Induction Lighting," *The Global Lighting Magazine*, Apr. 1996.

"The Advanced Energy PE 2500 W, 100 kHz Generator with Load Matching User Manual," Sep. 1989.

Kassakian et al., *Principal of Power Electronics*, 1991, Chapter 1, pp. 1–8.

Lieberman et al., *Principles of Plasma Discharges and Material Processing*; Chapter 12 "Inductive Discharges," pp. 387–389.

Benesch, *Breakdown in the Pretext Tokamak*, "Chapter Two–The Machine," Jun. 1981, pp. 15–16.

Akulina et al., "Injection and Confinement of Plasma in a Stellarator with a Multipolar (1=2) Helical Field, " *Proceedings of Conference of International Atomic Energy Agency* (1965) pp. 733–749.

Anderson, "Electrodeless Fluorescent Lamps Excited by Solenoidal Electric Field," *IES Transaction, Illuminating Engineering* (Apr. 1969) pp. 236–242.

Ashida et al., "Measurements of Pulsed–Power Modulated Argon Plasmas in a Inductively Coupled Plasma Source," *J. Vac. Sci. Technol.*, (Mar./Apr. 1996) pp. 391–397.

Asmussen, "Electron Cyclotron Resonance Microwave Discharges for Etching and Thin–Film Deposition," *Journal of Vacuum Science & Technology A: Vacuum, Surfaces, and Films*, vol. 7, No. 3, (May 1989) pp. 883–893. Abstract printed from Online Journal Publishing Service.

Bacri et al., "Influence of Departures From Complete Thermodynamic Equilibrium on Transport Coefficient Values: Application to an Oxygen Plasma," *Plasma Sources Sci. Technol.*, (1994) pp. 114–121.

Baldwin et al., "$MgF_2$ Optical Films: Ion–Beam–Assisted Deposition of Magnesium Flouride in a Conventional Electron Beam Evaporator and the Resulting Film Properties," *Society of Vacuum Coaters: $40^{th}$ Annual Technical Conference Proceedings*(1997) pp. 1–5.

Bell, "Ring Discharge Excitation of Gas Ion Lasers, " *Applied Physics Letters*, vol. 7, No. 7 (Oct. 1965) p. 190.

Benova et al., "Axial Distributions of Metastable Atoms and Charged Particles in an Ultrahigh Frequency Argon Plasma Column at Moderate Pressures," *J. Appl. Phys.*, vol. 79, No. 8 (Apr. 15, 1996) pp. 3848–3852.

Benova et al., "Theoretical Study of the Influence of a Metal Enclosure on the Parameters of a Plasma Column Sustained by a Traveling Electromagnetic Surface Wave, " *Physica Scripta*, vol. 43 (1991) pp. 68–73.

Bhave et al., "Two–and Three–Body Ion–Electron Recombination Rate Coefficients in Neon *," *Aust. J. Phys.*, vol. 48 (1995) pp. 503–513.

Bishop et al., "Power Balance Measurements and Particle Loss Rate in Ohmically Heated Discharges in the C Stellarator," *Plasma Physics and Controlled Nuclear Fusion Research: Proceedings of Second Conference of International Atomic Energy Agency*, vol. 2 (1966) pp. 673–685.

Bluem et al., "Spatial Investigation of a Large Diameter Microwave Plasma," *J. Phys. D: Appl. Phys* vol. 28 (1995) pp. 1529–1533.

Böhle et al., "On the Influence of Excited Atoms on the Electron Kinetics of a Surface Wave Sustained Argon Plasma," *Plasma Sources Sci. Technol.* vol. 3 (1994) pp. 80–87.

Boisse–Laporte et al., "Microwave Discharges Produced by Surface Waves in Argon Gas," *Journal of Physics D: Applied Physics*, vol. 20 (Feb. 14, 1987) p. 197.

Bol, "Density Fluctuations in the Etude Stellarator," *The Physics of Fluids*, vol. 7, No. 11 (Nov. 1964) pp. 1855–1856.

Bollinger et al., "Rapid Nonmechanical, Damage–Free Figuring of Optical Surfaces Using Plasma–Assisted Chemical Etching (PACE): Part I Experimental Results," *SPIE vol. 966 Advances in Fabrication and Metrology for Optics and Large Optics* (1988) pp. 82–90.

Bollinger et al., "Rapid Non–Contract Optical Figuring of Aspheric Surfaces With Plasma–Assisted Chemical Etching (PACE)," *SPIE vol. 1333 Advanced Optical Manufacturing and Testing* (1990) pp. 44–57.

Bollinger et al., "Rapid Optical Figuring of Aspherical Surfaces With Plasma Assisted Chemical Etching (PACE)," *SPIE vol. 1618 Large Optics II* (1991) pp. 14–21.

Boswell et al., "Etching of Si by $SF_6$ in a Radio Frequency Double Cathode," *Journal of Vacuum Science & Technology B: Microelectronics and Nanometer Structures*, vol. 5, No. 4 (Jul. 1987) pp. 883–888. Abstract printed from Online Journal Publishing Service.

Bourdon et al., "Three–Body Recombination Rate of Atomic Nitrogen in Low–Pressure Plasma Flows," *Physical Review E.*, vol. 54, No. 2 (Aug. 1996) pp. 1888–1898.

Carruth, Jr., et al., "Method for Determination of Neutral Atomic Oxygen Flux," *Rev. Sci. Instrum.*, vol. 61, No. 4 (1990) pp. 1211–1216.

Chen, "Industrial Applications of Low–Temperature Plasma Physics*," *Phys. Plasmas*, vol. 2, No. 6 Jun. 1995) pp. 2164–2175.

Cherrington, "Chapter 8: DC Discharges–The Positive Column," *Gaseous Electronics and Gas Lasers* Pergamon Press–New York (1979) pp. 144–160.

Chiu et al., "What the DryScrub ® System Can Do For PFC Gas Treatment?," *Electrochemical Technology Corp. Brochure* (undated).

Coburn et al., "Ion–and Electron–Assisted Gas–Surface Chemistry–An Important Effect in Plasma Etching," *Journal of Applied Physics*, vol. 50, No. 5 (May 1979) pp. 3189–3196. Abstract printed from Online Journal Publishing Service.

Cohen et al., "Induced Magnetic Field Effects in Inductively Coupled Plasmas," *Physics of Plasma*, vol. 3, No. 5 (May 1996) pp. 1839–1847. Abstract printed Online Journal Publishing Service.

Collins et al., "Measurement of the Rate Coefficient for the Recombination of $He^+$ with Electrons*," *Physical Review A*, vol. 6, No. 4 (Oct. 1972) pp. 1545–1558.

Darchicourt et al., "Influence of the Radical Electron Density Profile on the Determination of the Characteristics of Surface–Wave–Produced Discharges," *J. Phys. D: Applied Physics*, vol. 21 (1988) pp. 293–301.

Denneman, "Determination of Electromagnetic Properties of Low–Pressure Electrodeless Inductive Discharges," *J. Phys. D: Appl. Phys.* (1990) pp. 293–298.

Eckhartt et al., "Comparison of Alkali Plasma Loss Rates in a Stellarator and in a Toroidal Device With Minimum Mean–B Properties," *Plasma Physics and Controlled Nuclear Fusion Research: Proceedings of Second Conference of International Atomic Energy Agency*, vol. 2 (1996) pp. 719–731.

Evans, "Discussion (of 'Electrodeless Flourescent Lamps Excited by Solenoidal Electric Field' by Anderson)," *IES Transaction, Illuminating Engineering* (Apr. 1969) pp. 242–244.

Feoktistov et al., "Self–Consistent Modeling of Low–Pressure RF Discharges in Oxygen Plasma, " *J. Phys. D: Appl. Phys.*. vol. 26 (1995) pp. 1346–1353.

Ferreira, "Theory of a Plasma Column Sustained by a Surface Wave," *J. Phys. D: Appl. Phys.* (1981) pp. 1811–1830.

Ferreira, "Modeling of a Low–Pressure Plasma Column Sustained by a Surface Wave," *J. Phys. D: Appl. Phys.*, vol. 16 (1983) pp. 1673–1685.

Ferreira, "The Similarity Laws for the Maintenance Field and the Absorbed Power per Electron in Low–Pressure Surface Wave Produced Plasmas and their Extension to HF Plasmas in General," *Physica Scripta.*, vol. 38 (1988) pp. 382–399.

Ferreira et al., "Quasi–Neutral Theory of Positive Columns in Electronegative Gases," *J. Phys. D: Appl. Phys.*, vol. 21 (1988) pp. 1403–1413.

Ferreira, "Kinetic Modeling of Microwave Discharges," *Microwave Discharges: Fundamentals and Applications* (1993) pp. 313–337.

Fiala et al., "Two Dimensional, Hybrid Model of Low–Pressure Glow Discharges," *Physical Review E.,* vol. 49, No. 6 (Jun. 1994) pp. 5607–5622.

Fulton, "Application of Ion–Assisted–Deposition Using a Gridless End–Hall Ion Source for Volumn Manufacturing of Thin–Film Optical Filters," *Optical Interferance Coatings: Proceedings–SPIE The International Society for Optical Engineering* (1994) pp. 374–393.

Fulton et al., "Application of Residual Stress Analysis for Ion–Assist–Deposited (IAD) Thin–Films Manufactured Using a Girdless End–Hall Ion Source," *Optical Interference Coatings: Technical Digest Series*, vol. 17 (1995) pp. 101–103.

Gallatin et al., "Predicted Polishing Behavior of Plasma Assisted Chemical Etching (PACE) From a Unified Model of the Temporal Evolution of Etched Surfaces," *SPIE Advances in Fabrication and Metrology for Optics and Large Optics*, vol. 966 (1988) pp. 98–107.

Gallatin et al., "Unified Approach to the Temporal Evolution of Surface Profiles in Solid Etch and Deposition Processes," *J. Appl. Phys.*, vol. 65, No. 12 (Jun. 1989) pp. 5078–5088.

Golant et al., "Plasma Compression by a Magnetic Field in a Toroidal–Type Device," *Proceedings of Conference of International Atomic Energy Agency* (1965) pp. 830–850.

Gousset et al., "Experimental Study of a D.C. Oxygen Glow Discharge by V.U.V. Absorption Spectroscopy," *Plasma Chemistry and Plasma Processing* vol. 7, No. 4, (1987) pp. 409–427.

Gousset et al., "Electron and Heavy–Particle Kinetics in the Low Pressure Oxygen Positive Column," *J. Phys. D. Appl. Phys.*, vol. 24 (1991) pp. 290–300.

Granier et al., "Characterisation of Oxygen Discharges," Journal of Physics D: Applied Physics, vol. 22 (1989) pp. 1487–1496.

Granier et al., "Diagnostics in $O_2$ Helicon Plasmas for $SiO_2$ Deposition," *Plasma Sources Sci. Technol.*, vol. 6 (1997) pp. 147–156.

Hartney et al., "Critical Review: Oxygen Plasma Etching for Resist Stripping and Multilayer Lithography," *J. Vac. Sci. Technol.*, pp.1 (Jan./Feb. 1989).

Heimer et al., "Ponderomotive Transport of Charge in the Induction Plasma," *J. Vac. Sci. Technol.*, (Jan./Feb. 1994) pp. 507–511.

Henriksen et al., "Electromagnetic Field in Electrodeless Discharge," *Journal of Applied Physics*, vol. 42, No. 13 (Dec. 1971) pp. 5460–5464.

Heshmaty et al., "Approaches Explored for Producing a Variety of Ion–Assisted–Deposited Thin–Film Coatings Using an End–Hall Ion Source," *Developments in Optical Component Coatings: Proceedings of SPIE Conference*, vol. 2776 (1996) pp. 114–125.

Hopwood, "Review of Inductively Coupled Plasmas for Plasma Processing," *Plasma Sources Sci. Technol.*, (1992) pp. 109–116.

Hopwood et al., "Electromagnetic Fields in a Radio–Frequency Induction Plasma," *Journal of Vacuum Science & Technology A: Vacuum, Surfaces, and Films*, vol. 11, No. 1, (Jan. 1993) pp. 147–151. Abstract printed from Online Journal Publishing Service.

Hopwood et al., "Labgmuir Probe Measurements of a Radio Frequency Induction Plasma," *Journal of Vacuum Science & Technology A: Vacuum, Surfaces, and Films*, vol. 11, No. 1 (Jan 1993) pp. 152–156. Abstract printed from Online Journal Publishing Service.

Kita et al., "Rocket Observation of Atomic Oxygen and Night Airglow: Measurement of Concentration with an Improved Resonance Fluorescence Technique," *Annales Geophysicae* vol. 14 (1996) 227–237.

Kolobov et al., "Electron Kinetics and Non–Joule Heating in Near–Collisionless Inductively Coupled Plasmas," *Physical Review E*, vol., 55, No. 3 (Mar. 1997) 3408–3422.

Kortshagen et al., "Determination of Electron Energy Distribution Functions in Surface Wave Produced Plasmas: I. Modeling," *J. Phys. D: Appl. Phys.*, vol. 24 (1991) pp. 1571–1584.

Kortshagen et al., "Determination of Electron Energy Distribution Functions in Surface Wave Produced Plasmas: II. Measurements," *J. Phys. D: Appl. Phys.*, vol. 24 (1991) pp. 1585–1593.

Kortshagen, "Experimental and Theoretical Determination of Electron Energy Distribution Functions in Surface Wave Plasmas," *Microwave Discharges: Fundamentals and Applications* (1993) pp. 303–312.

Kouznetsov et al., "Modeling Electronegative Discharges at Low Pressure," *Plasma Sources Science & Technology*, vol. 5, No. 4 (Nov. 1996) Abstract printed from Insititue for Scientific Information.

Lee et al., "Global Model for High Pressure Electronegative Radio–Frequency Discharges," *Journal of Vacuum Science & Technology A–Vacuum Surfaces and Films* vol. 15, No. 1 (Jan.–Feb. 1997) 113–126. Abstract printed from Institute for Scientific Information.

Lichtenberg et al., "Modeling Plasma Discharges at High Electronegativity," *Plasma Sources Sci. Technol.* vol. 6 (1997) 437–449.

Lister et al., "Modeling of Inductively Coupled Discharges With Internal and External Coils," *Plasma Sources Sci. Technol.* vol. 1 (1992) 67–73.

Malik et al., "Overview of Plasma Source Ion Implantation Research at University of Wisconsin–Madison," *Journal of Vacuum Science & Technology B: Microelectronics and Nanometer Structures* vol. 12, No. 2 (Mar. 1994) 843–849. Abstract printed from Online Journal Publishing Service.

Margot et al., "Modeling of Surface–Wave–Sustained Plasmas in Static Magnetic Fields: A Tool for the Study of Magnetically Assisted HF Plasmas," *Microwave Discharges: Fundamentals and Applications* (1993) 141–159.

Michelt et al., "Measurement of the Rotational Temperature of Oxygen in a High–Power Inductively Coupled Plasma," *J. Phys. D: Appl. Phys.* vol. 28 (1995) 2600–2606.

Moisan et al., "A Small Microwave Plasma Source for Long Column Production Without Magnetic Field," *IEEE Transactions on Plasma Science*, vol. PS–3, No. 2 (Jun. 1975) p. 55.

Moisan et al., "Plasma Sources Based on the Propagation of Electromagnetic Surface Waves," *J. Phys. D: Appl. Phys.* vol. 24 (1991) pp. 1025–1048.

Morrow et al., "In Situ Measurement of Atomic Nitrogen in the Ground ($^4$S) and Metastable ($^2$D) and ($^2$P) States by Resonance Fluorescence for Project Aries," *Centre for Research in Experimental Space Science* (Apr. 1981).

Niederwald et al., "IAD of Oxide Coatings at Low Temperature: A Comparison of Processes based on Different Ion Sources," *Proc. SPIE* vol. 3133 (1997) pp. 205–213.

Okada et al., "Microwave Determined of the Coefficient of Dissociative Recombination of $Ar_2$ in AR Afterglow," *J. Phys. D: Appl. Phys.* vol. 26 (1993) 1680–1686.

Ono et al., "Effect of Annealing on Mechanical Properties of Electron–Irradiated Aluminum single Crystals at $23°K^{1,}$," *Applied Physics Letters* vol. 7, No. 7 (Oct. 1, 1965) pp. 191.

Pawlewicz et al., "Low–Energy High–Flux Reactive Ion Assisted Deposition of Oxide Optical Coatings: Performance, Durability, Stability and Scalability," *SPIE Proceedings 2261* (1994) 1–12.

Perry et al., "The Application of the Helicon Source of Plasma Processing," *Journal of Vacuum Science & Technology B: Microelectronics and Nanometer Structures* vol. 9, No. 2 (Mar 1991) 310–317. Abstract printed from Online Journal Publishing Service.

Persson "Inertia–Controlled Ambipolar Diffusion," *The Physics of Fluids* vol. 5, No. 12 (Dec. 1962) 1625–1632.

Persson "Brush Cathode Plasma – A Well–Behaved Plasma," *Journal of Applied Physics* vol. 36, No. 10 (Oct. 1965) 3086–3094.

Phelps "Role of Molecular Ions, Metastable Molecules, and Resonance Radiation in the Breakdown of Rare Gases," *The Physical Review* vol. 117, No. 3 (Feb. 1, 1960) 619–632.

Piejak et al., "A Simple Analysis of an Inductive RF Discharge," *Plasma Sources, Science and Technology*, vol. 1, No. 3, (1992) pp. 179–186.

Piejak et al., "The Electric Field and Current Density in a Low–Pressure Inductive Discharge Measured with Different B–dot Probes," *J. Appl. Phys.* vol. 81, No. 8, (Apr. 15, 1997) 3416–3421.

Popov "Characteristics of Electron Cyclotron Resonance Plasma Sources,"*Journal of Vacuum Science & Technology A: Vacuum, Surfaces, and Films* vol. 7, No. 3 (May 1989) 894–898. Abstract printed from Online Journal Publishing Service.

Rapp et al., "Charge Exchange Between Gaseous Ions and Atoms," *Journal of Chemical Physics* vol. 37, No. 11 (Dec. 1, 1962) 2631–2645.

Resonance Ltd., *Operation Manual for Vacuum Monochromator Model #VS2FS* (Sep. 1993).

Resonance Ltd., *Operation Manual for RF Powered Line Sources* (undated).

Sato, "Plasma Density Profile and Electron Temperature in Discharge Positive Columns at Intermediate Pressures: Examination of Ingold's Approximation,"*J. Phys. D: Appl. Phys.* vol. 26 (1993) 1687–1690.

Schiffer et al., "Negative–Oxygen–Ion Detection by a Crossed–Beam Photodetachment Technique," *Plasma Sources Sci. Technol.* vol. 4 (1995) 345–352.

Self et al., "Static Theory of a Discharge Column at Intermediate Pressures," *The Physics of Fluids* vol. 9, No. 12 (Dec. 1966) 2486–2492.

Sirghi et al., "Nonlocal Particle Loss Effects on the Electron Kinetics in a Direct Current Helium Diffusion–Controlled Positive Column," *Phys. Plasmas* vol. 4, No. 4 (Apr. 1997) 1160–1165.

Smirnov et al., "Resonance Charge Transfer in Inert Gases," *Soviet Physics–Technical Physics* vol. 10, No. (1965) 83–92.

Smith, "Section 9.6: Plasma Chemistry,"*Thin–Film Deposition: Priciples and Practice* McGraw–Hill–New York: (1995) pp. 616–617.

Stodiek et al., "Plasma Confinement in Low–Density C Stellarator Discharges,"*Proceedings of a Conference on Plasma Physics and Controlled Nuclear Fusion Research* CN–21/120, International Atomic Energy Agency (1965) pp. 687–703.

Stowers et al., "Review of Precision Surface Generating Processes and Their Potential Application to the Fabrication of Large Optical Components*," *SPIE Advances in Fabrication and Metrology for Optics and Large Optics*, vol. 966_(1988) pp. 62–73.

Suchel et al., "Properties of $TiO_2$ and $SiO_2$ Films Prepared by Ion–Assisted Deposition Using a Gridless End Hall Ion Source," *Society of Vacuum Coaters: 36$^{th}$ Annual Technical Conference Proceedings* (1993) pp. 82–87.

Sugai et al., "Diagnostics and Control of Radicals in an Inductively Coupled Etching Reactor,"*Journal of Vacuum Science & Technology A., Vac. Surf. Films*, vol. 13, No. 3, Pt. 1 (May/Jun. 1995) pp. 887–893.

Toader "On the Constricted Neon Positive Column," *J. Phys. D: Appl. Phys.*. vol. 28 (1995) 75–80.

Tuszewski et al., "Composition of the Oxygen Plasmas from Two Inductively Coupled Sources," *J. Vac. Sci. Technol. A* vol. 13, No. 3 (May/Jun. 1995) 839–842.

Tuszewski "Electronegative Inductive Discharge Instability," *J. Appl. Phys.* vol. 79, No. 12 (Jun. 15, 1996) 8967–8975.

Tuszewski "Enhanced Radio Frequency Field Penetration in an Inductively Coupled Plasma," *Physical Review Letters* vol. 77, No. 7 (Aug. 12, 1996) 1286–1289.

Tuszewski, "Inductive Electron Heating Revisted*," *Phy. Plasmas* vol. 4, No. 5 (May 1997) 1922–1928.

Vahedi et al., "Analytic Model of the Ion Angular Distribution in a Collisional Sheath," *Journal of Vacuum Science & Technology A: Vacuum, Surfaces, and Films* vol. 11, No. 4 (Jul. 1993) 1275–1282. Abstract printed Online Journal Publishing Service.

Vahedi "Modeling and Simulation of RF Discharges Used for Plasma Processing," *Dissertation Submitted in Partial Satisfaction of Requirement for Ph.D. in Electrical Engineering and Computer Science from University of California at Berkeley* (1993).

Vialle et al., "Kinetics of O($^1$S) and O($^1$D) Metastable Atoms in a DC Oxygen Glow Discharge,"*J. Phys. D: Appl. Phys.*, vol. 24 (1991) pp. 301–308.

Vičk, "A Collisional–Rediative Model Applicable to Argon Discharges Over a Wide Range of Conditions: Formulations and Basic Data," *J. App. D: Appl. Phys.*, vol. 22 (1989) 623–631.

Whitmer et al., "Effects of a Velocity–Dependent Collision Frequency on Wave–Plasma Interactions," *The Physics of Fluids*, vol. 9 (Apr. 1996) 768–773.

Yoshikawa et al., "Ion Heating in the C Stellarator,"*Plasma Physics and Controlled Nuclear Fusion Research: Proceedings of Second Conference of International Atomic Energy Agency*, (1965) 925–939.

Zarowin et al., "Quasi–CW, High Numerical Aperture, Inductively Excited Ion Laser*," *Applied Physics Letters*, vol. 11, No. 2 (Jul. 15, 1967) pp. 47–48.

Zarowin, "Relation Between the RF Discharge Parameters and Plasma Etch Rates, Selectivity, and Anisotrophy," *J. Vac. Science Technology* (Oct.–Dec. 1984) pp. 1537–1549.

Zarowin, "A Theory of Plasma–Assisted Chemical Vapor Transport Processes," *J. Appl. Phys.* vol. 57, No. 3 (Feb. 1985) pp. 929–942.

Zarowin et al., Rapid, Non–Mechanical, Damage Free Figuring of Optical Surfaces Using Plasma Assisted Chemical Etching (PACE): Part II Theory & Process Control, *SPIE vol. 966 Advances in Fabrication and Metrology for Optics and Large Optics* (1988) pp. 91–97.

Zarowin et al., "Rapid, Non–Contact Damage Free Shaping of Optical & Other Surfaces With Plasma Assisted Chemical Etching," *IEEE 43d Annual Symposium on Frequency Control* (1989) pp. 623–626.

Zarowin, "A Comparison Using Surface Evolution Theory of the Smoothing and Figuring of Optics by Plasma Assisted Chemical Etching and Ion Milling," *SPIE vol. 1618 Large Optics II* (1991) pp. 22–26.

Zhang et al., "Modification of the Density Profile in a Toroidal Plasma Source Using a Bias Electric Field," *Appl. Phys. Lett.*, vol. 70, No. 23 (Jun. 9, 1997) pp. 3090–3092.

Zhelyazkov et al., "Axial Structure of Low–Pressure High–Frequency Discharges Sustained by Traveling Electromagnetic Surface Waves," *Physics Reports–Review Section of Physics Letters*, (1995) pp. 79–201.

CONTROLLING POWER BY DUTY CYCLE

CONTROLLING POWER WITH CONSTANT-CURRENT SOURCE

TOROIDAL LOW-FIELD REACTIVE GAS SOURCE

RELATED APPLICATIONS

This is a continuation-in-part of U.S. patent application Ser. No. 08/883,281, filed Jun. 26, 1997, the entirety of which is incorporated herein by reference. In addition, this application claims priority to U.S. Provisional Patent Application Ser. No. 60/119,635, filed on Feb. 11, 1999.

FIELD OF THE INVENTION

This invention relates generally to the field of generating activated gas containing ions, free radicals, atoms and molecules and to apparatus for and methods of processing materials with activated gas.

BACKGROUND OF THE INVENTION

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e. a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require shielding the material being processed from the plasma because the material is sensitive to damage caused by ions or because the process has high selectivity requirements. Other applications require direct exposure of the material being processed to a high density plasma. One such application is generating ion-activated chemical reactions. Other such applications include etching of and depositing material into high aspect ratio structures.

For some applications, activated gases need to be generated at or near the surfaces to be treated, because of the high reactivity and short lifetime of the gases. One example is atomic fluorine, which can be used to clean chemical vapor deposition (CVD) chambers for deposition of thin films onto substrate surfaces. CVD chambers need to be routinely cleaned, in order to remove the deposits that build up on the surfaces of chamber parts other than the substrate surfaces. Whereas wet cleaning of the chambers is labor intensive and hazardous to the workers, cleaning the chamber with atomic fluorine generated by a plasma source allows the deposits to be removed without opening the chamber to atmosphere, improving tool productivity and working conditions. Typical source gases for atomic fluorine include perfluorocompounds (PFCs) such as $NF_3$, $CF_4$, $CHF_3$, $C_2F_6$, and $C_4F_8$. A high dissociation rate of the PFCs is important to reduce their emission to the environment and to improve process throughput. Another example is photoresist removal in microelectronics fabrication. After pattern generation, photoresist is removed by exposing the wafer surface to atomic oxygen generated by a plasma source. Atomic oxygen reacts rapidly and selectively with photoresist, allowing the process to be conducted in a vacuum and at relatively low temperature.

Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into the plasma. Microwave discharges are achieved by directly coupling microwave energy through a microwave-passing window into a discharge chamber containing a gas. Microwave discharges are advantageous because they can be used to support a wide range of discharge conditions, including highly ionized electron cyclotron resonant (ECR) plasmas.

RF discharges and DC discharges inherently produce high energy ions and, therefore, are often used to generate plasmas for applications where the material being processed is in direct contact with the plasma. Microwave discharges produce dense, low ion energy plasmas and, therefore, are often used to produce streams of activated gas for "downstream" processing. Microwave discharges are also useful for applications where it is desirable to generate ions at low energy and then accelerate the ions to the process surface with an applied potential.

However, microwave and inductively coupled plasma sources require expensive and complex power delivery systems. These plasma sources require precision RF or microwave power generators and complex matching networks to match the impedance of the generator to the plasma source. In addition, precision instrumentation is usually required to ascertain and control the actual power reaching the plasma.

RF inductively coupled plasmas are particularly useful for generating large area plasmas for such applications as semiconductor wafer processing. However, prior art RF inductively coupled plasmas are not purely inductive because the drive currents are only weakly coupled to the plasma. Consequently, RF inductively coupled plasmas are inefficient and require the use of high voltages on the drive coils. The high voltages produce high electrostatic fields that cause high energy ion bombardment of reactor surfaces. The ion bombardment deteriorates the reactor and can contaminate the process chamber and the material being processed. The ion bombardment can also cause damage to the material being processed.

Faraday shields have been used in inductively coupled plasma sources to contain the high electrostatic fields. However, because of the relatively weak coupling of the drive coil currents to the plasma, large eddy currents form in the shields resulting in substantial power dissipation. The cost, complexity, and reduced power efficiency make the use of Faraday shields unattractive.

Plasma sources can also be used to remove harmful gases from gas streams. Concern over global warming has driven semiconductor and other manufacturing industries to reduce their emission of PFCs. Conventional methods of abating environmental pollutants typically utilize thermal techniques which break down pollutant molecules by burning the gases at a high temperature. Due to the thermal stability of many of the PFCs, however, the thermal techniques are not very effective, and can be very expensive.

SUMMARY OF THE INVENTION

The invention relates to an apparatus for generating excited gases containing ions, free radicals, atoms and molecules, and for abating hazardous compounds.

In one embodiment, the invention provides an improved toroidal low-field plasma source with an ignition control circuit that allows plasma ignition within a wider range of gas conditions than are permitted generally by prior art plasma sources. In another embodiment, the invention improves the power efficiency of a toroidal low-field plasma source by automatically adjusting the power delivered to the plasma based on the load to the power supply. In another embodiment, the invention improves the dissociation and abatement efficiencies of a toroidal low-field plasma source by providing a gas mixing device.

In one embodiment, the invention provides a method for operating a plasma source over a wider pressure range than generally allowed by prior art plasma sources. In another embodiment, the invention provides a method for increasing the output of atomic species from a plasma source. In another embodiment, the invention provides a method for increasing the plasma etch rate of organic materials.

In another embodiment, the invention provides an apparatus and method for efficiently removing PFCs and other hazardous gaseous compounds from effluent gas streams, by converting the hazardous compounds into scrubbable products.

Accordingly, the present invention features an apparatus for dissociating gases into a plasma that includes a plasma chamber. In one embodiment, the apparatus includes a process chamber that is coupled to the plasma chamber and positioned to receive reactive gas generated by a plasma in the plasma chamber.

The apparatus also includes a transformer having a primary winding and having a magnetic core surrounding a portion of the plasma chamber. The apparatus also includes a switching power supply. In one embodiment, the switching power supply includes a switching semiconductor device that is directly coupled to a voltage supply. The output of the switching semiconductor device can be directly coupled to the primary winding of the transformer. The switching semiconductor device can be a switching transistor.

In one embodiment, the apparatus includes a free charge generator which assists the ignition of a plasma in the chamber. In an embodiment, an electrode is positioned in the chamber to generate the free charges. In another embodiment, an electrode is capacitively coupled to the chamber to generate the free charges. In another embodiment, an ultraviolet light source is optically coupled to the chamber to generate the free charges.

In one embodiment, the apparatus includes a circuit for controlling the ignition of the plasma in the chamber. In one embodiment, the ignition control circuit comprises a resonance capacitor which forms a resonant circuit with the switching power supply at the switching frequency of the switching power supply. The resonant circuit outputs a resonance voltage on the primary winding. The ignition control circuit also comprises an electronic control circuit which controls ignition of the plasma by regulating the current in the primary winding.

In another embodiment, the ignition control circuit comprises a resonance capacitor connected to the primary winding so as to form a resonant circuit at a particular frequency. The ignition control circuit also comprises an electronic control circuit which controls ignition of the plasma by tuning the cycle rate of the switching power supply to the resonant frequency prior to, during, and after ignition.

In one embodiment, the apparatus includes a power control circuit for adjusting the power delivered to the plasma based on the size of the plasma load. In one embodiment, the power control circuit comprises an electronic control circuit that includes a current comparator and a microprocessor. The control circuit adjusts the output power of the switching power supply based on the size of the load, by varying the duty cycle of the switching power supply.

In another embodiment, the power control circuit comprises a constant-current RF switching power supply that includes an inductive element connected in series with the plasma chamber and the transformer. The inductive element maintains current through the load at about the value of the initial inductor current, thereby adjusting power in the switching power supply based on the size of the load.

In one embodiment, the apparatus includes a gas mixing device that improves the dissociation and abatement efficiencies of the plasma source.

The present invention also features a method for dissociating gases into a plasma and controlling plasma ignition. The method includes providing a plasma chamber, and a transformer having a primary winding and having a magnetic core surrounding a portion of the chamber. The method further includes coupling a resonance capacitor to the primary winding and to a switching power supply so that the resonance capacitor and the switching power supply form a resonant circuit at the switching frequency of the switching power supply. The method includes placing a resonance voltage on the primary winding, and switching off the resonant circuit from the primary winding subsequent to ignition of the plasma. The method also includes the step of regulating current in the primary winding during and after the resonance voltage phase, and after plasma ignition.

Alternatively, the method for ignition control according to the present invention comprises the step of coupling a resonance capacitor to the primary winding and a switching power supply so that the resonance capacitor and the switching power supply form a resonant circuit at a predetermined frequency. The method also includes the step of tuning the cycle rate of the switching power supply to control plasma ignition.

The present invention also features a method for controlling power of the toroidal low-field plasma source of the present invention. In one embodiment, the method includes varying the duty cycle of the switching power supply, thereby adjusting the average output power of the switching power supply based on the size of the plasma load.

In another embodiment, the method for controlling power includes providing a constant-current RF switching power supply that contains an inductive element connected in series with the plasma load. The method includes maintaining current though the load at about the value of the initial inductor current so that power in the switching power supply is adjusted based on the size of the load.

The present invention also features a method for operating a toroidal low-field plasma source over a wider pressure range than generally allowed by prior art plasma sources. The present invention also features a method for increasing the output of atomic species from a toroidal low-field plasma source. The method includes adding a noble gas to a feed gas, before the gases are fed to the plasma source.

The present invention also features a method for increasing the plasma etch rate of organic materials such as photoresists. The method includes feeding a mixture of a noble gas with oxygen and nitrogen into a plasma source, and raising the pressure in the process chamber to above about 50 torr.

The present invention also features a method for abating toxic gases with a toroidal low-field plasma source. The method includes activating a PFC in the plasma chamber.

The method further includes converting the PFC into a scrubbable product and removing the scrubbable product from the effluent gas stream in a scrubber.

The present invention further features a method for cooling the plasma chamber. The plasma chamber can be cooled by one or more cooling plates which are mechanically attached and thermally bonded to the plasma chamber. A cooling fluid flows inside the cooling plates, and the fluid is not in contact with the plasma chamber itself Separating the plasma chamber from the cooling fluids allows the plasma chamber to be made of materials that are compatible with the reactive plasma regardless of their compatibility with the cooling fluids.

BRIEF DESCRIPTION OF THE DRAWINGS

This invention is described with particularity in the appended claims. The above and further advantages of this invention can be better understood by referring to the following description taken in conjunction with the accompanying drawings, in which:

DETAILED DESCRIPTION

Figure 1:
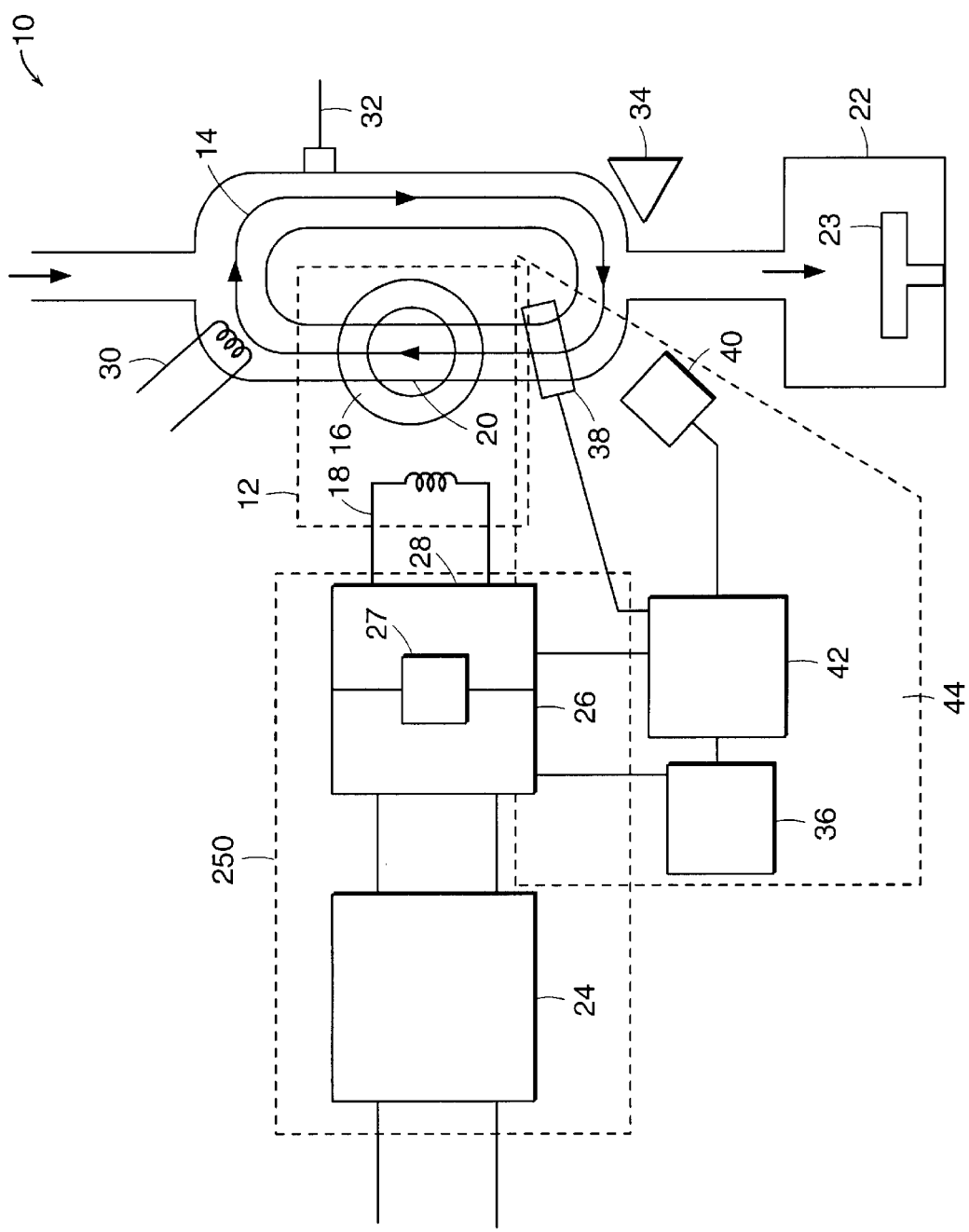
FIG. 1 is a schematic representation of a toroidal low-field plasma source for producing activated gases that embodies the invention.

FIG. 1 is a schematic representation of an embodiment of a toroidal low-field plasma source 10 for producing activated gases according to the present invention. The source 10 includes a power transformer 12 that couples electromagnetic energy into a plasma 14. The power transformer 12 includes a high permeability magnetic core 16, a primary coil 18, and a plasma chamber 20. The plasma chamber 20 allows the plasma 14 to form a secondary circuit of the transformer 12. The power transformer 12 can include additional magnetic cores and conductor primary coils (not shown) that form additional secondary circuits.

The plasma chamber 20 can be formed from a metallic material such as aluminum or a refractory metal, or can be formed from a dielectric material such as quartz. One or more sides of the plasma chamber 20 can be exposed to a process chamber 22 to allow charged particles generated by the plasma 14 to be in direct contact with a material to be processed (not shown). A sample holder 23 can be positioned in the process chamber 22 to support the material to be processed. The material to be processed can be biased relative to the potential of the plasma.

The plasma source 10 also comprises a switching power supply 250. In one embodiment, the switching power supply 250 includes a voltage supply 24 directly coupled to a switching circuit 26 containing a switching semiconductor device 27. The voltage supply 24 can be a line voltage supply or a bus voltage supply. The switching semiconductor device 27 can be a set of switching transistors. The switching circuit 26 can be a solid state switching circuit. An output 28 of the circuit 26 can be directly coupled to the primary winding 18 of the transformer 12.

The toroidal low field plasma source 10 can include a means for generating free charges that provides an initial ionization event that ignites a plasma in the plasma chamber 20. The initial ionization event can be a short, high voltage pulse that is applied to the plasma chamber. The pulse can have a voltage of approximately 500–10,000 volts and can be approximately 0.1 to 10 microseconds long. A noble gas such as argon can be inserted into the plasma chamber 20 to reduce the voltage required to ignite a plasma. Ultraviolet radiation can also be used to generate the free charges in the plasma chamber 20 that provide the initial ionization event that ignites the plasma in the plasma chamber 20.

In one embodiment, the short, high voltage electric pulse is applied directly to the primary coil 18 to provide the initial ionization event. In another embodiment, the short, high voltage electric pulse is applied to an electrode 30 positioned in the plasma chamber 20. In another embodiment, the short, high voltage electric pulse is applied to an electrode 32 that is capacitively coupled to the plasma chamber 20 by a dielectric. In another embodiment, the plasma chamber 20 is exposed to ultraviolet radiation emitting from an ultraviolet light source 34 that is optically coupled to the plasma chamber 20. The ultraviolet radiation causes the initial ionization event that ignites the plasma.

The toroidal low field plasma source 10 can also include a circuit 36 for measuring electrical parameters of the primary winding 18. Electrical parameters of the primary winding 18 include the current driving the primary winding 18, the voltage across the primary winding 18, the bus or line voltage supply generated by the voltage supply 24, the average power in the primary winding 18, and the peak power in the primary winding 18.

In addition, the plasma source 10 can include a means for measuring relevant electrical parameters of the plasma 14. Relevant electrical parameters of the plasma 14 include the plasma current and power. For example, the source 10 can include a current probe 38 positioned around the plasma chamber 20 to measure the plasma current flowing in secondary of the transformer 12. The plasma source 10 can also include an optical detector 40 for measuring the optical emission from the plasma 14. In addition, the plasma source 10 can include a power control circuit 42 that accepts data from one or more of the current probe 38, the power detector 40, and the circuit 26 and then adjusts the power in the plasma by adjusting the current in the primary winding 18.

In operation, a gas is bled into the plasma chamber 20 until a pressure substantially between 1 millitorr and 100 torr is reached. The gas can comprise a noble gas, a reactive gas or a mixture of at least one noble gas and at least one reactive gas. The circuit 26 containing switching semiconductor devices supplies a current to the primary winding 18 that induces a potential inside the plasma chamber 20. The magnitude of the induced potential depends on the magnetic field produced by the core and the frequency at which the switching semiconductor devices operate according to Faraday's law of induction. An ionization event that forms the plasma can be initiated in the chamber. The ionization event can be the application of a voltage pulse to the primary winding or to the electrode 30 in the chamber 20. Alternatively, the ionization event can be exposing the chamber to ultraviolet radiation.

Once the gas is ionized, a plasma is formed which completes a secondary circuit of the transformer. The electric field of the plasma can be substantially between 1–100 V/cm. If only noble gases are present in the plasma chamber 20, the electric fields in the plasma 14 can be as low as 1 volt/cm. If, however, electronegative gases are present in the chamber, the electric fields in the plasma 14 are considerably higher.

The plasma source 10 is advantageous because its conversion efficiency of line power into power absorbed by the plasma is very high compared with prior art plasma sources. This is because the circuit 26 containing one or more switching semiconductor devices that supplies the current to the primary winding 18 is highly efficient. The conversion efficiency can be substantially greater than 90%. The plasma source 10 is also advantageous because it does not require the use of conventional impedance matching networks or conventional RF power generators. This greatly reduces the cost and increases the reliability of the plasma source.

In addition, the plasma source 10 is advantageous because it operates with low electric fields in the plasma chamber 20. Low electric fields are desirable because a low potential difference between the plasma and the chamber will substantially reduce energetic ion bombardment within the plasma chamber 20. Reducing energetic ion bombardment in the plasma chamber 20 is desirable because it minimizes the production of contaminating materials within the plasma chamber 20, especially when chemically reactive gases are used. For example, when fluorine based gases such as $NF_3$ and $CF_4/O_2$ are used in the plasma source 10 of the present invention, including a plasma chamber formed from a fluorine resistant material, no or minimal erosion of the chamber was observed after extended exposure to the low ion temperature fluorine plasma.

Figure 2:
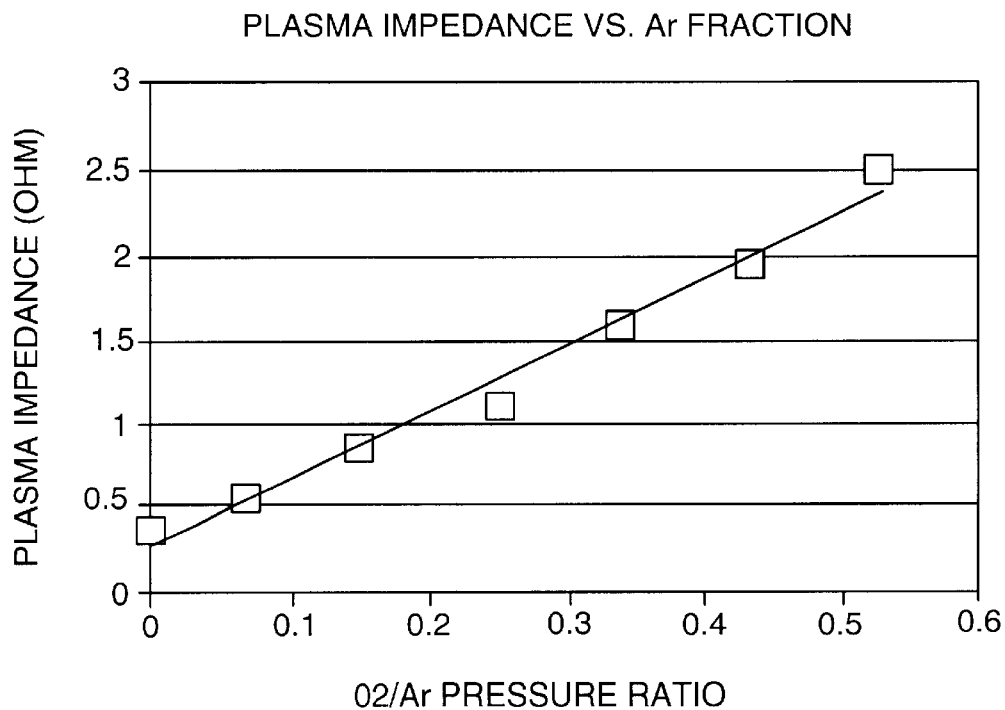
FIG. 2 illustrates a plot of plasma impedance as a function of the fraction of oxygen/argon plasma in a toroidal low-field plasma source constructed according to the present invention.

The toroidal plasma source with low electric field can be operated by mixing the inlet reactive gas with a noble gas (e.g. argon) to reduce the electric field required to sustain the plasma. A toroidal plasma geometry inherently eliminates current-terminating electrodes and the associated cathode potential drop. A toroidal geometry can be described as doughnut shaped. The impedance of an oxygen/argon plasma in a toroidal plasma source is presented in FIG. 2 to illustrate the effect of mixing a noble gas (Ar) with a reactive gas ($O_2$) in reducing plasma impedance. Increasing the fraction of the noble gas in the gas mixture consistently reduces the plasma impedance. Consequently, the voltage that is required to sustain a plasma decreases with increasing fraction of the noble gas in the gas mixture.

In addition, a sufficiently large cross section of the plasma channel can be provided in the toroidal plasma source. The applicants have found that plasmas in small cross section channels are difficult to sustain and requires high electric fields to maintain. The higher required electric field may be due to increased plasma loss to the wall surfaces, and can also relate to plasma instabilities that can arise from increased plasma density gradients in small plasma channels. In practice, however, the plasma channel 115, shown in FIG. 4, should not be too large compared to the size of the plasma itself. In most applications, efficient use of inlet process gas is desired. For toroidal plasma sources operating at pressures of 1 millitorr to 1 atmosphere and plasma currents of 10–1000 A, a cross section of 2–20 $cm^2$ in the plasma channel is preferred.

The lower impedance of a noble gas plasma also facilitates plasma ignition. Because igniting a plasma requires higher electric field than sustaining a plasma under the same gas condition, it is preferred to ignite a plasma in a pure noble gas environment when the electric field must be limited. The reactive gases can then be mixed into the noble gas after a plasma is ignited in a noble gas environment.

The plasma source 10 is useful for processing numerous materials such as solid surfaces, powders, and gases. The plasma source 10 is particularly useful for cleaning process chambers in semiconductor processing equipment such as thin film deposition and etching systems. The plasma source 10 is also particularly useful for providing an ion source for ion implantation and ion milling systems.

In addition, the plasma source 10 is useful for providing a source for etching systems used for etching numerous materials used to fabricate semiconductor devices such as silicon, silicon dioxide, silicon nitride, aluminum, molybdenum, tungsten and organic materials such as photoresists, polyimides and other polymeric materials. The plasma source 10 is also useful for providing a source for plasma enhanced chemical vapor deposition of materials of numerous thin films such as diamond films, silicon dioxide, silicon nitride, and aluminum nitride.

The plasma source is also useful for generating reactive gases such as atomic fluorine, atomic chlorine and atomic oxygen. Such reactive gases are useful for reducing, converting, stabilizing or passivating various oxides such as silicon dioxide, tin oxide, zinc oxide and indium-tin oxide. Applications include fluxless soldering, removal of silicon dioxide from silicon surface and passivation of silicon surface prior to wafer processing.

Other applications of the plasma source 10, for example, include modification of surface properties of polymers, metals, ceramics and papers. The plasma source 10 can also be used for abatement of environmentally hazardous gases including fluorine containing compounds such as $CF_4$, $NF_3$, $C2F_6$, $CHF_3$, $SF_6$, and organic compounds such as dioxins and furans and other volatile organic compounds. In addition, the plasma source 10 can be used to generate high fluxes of atomic oxygen, atomic chlorine, or atomic fluorine for sterilization. The plasma source 10 can also be used on an atmospheric pressure torch.

Figure 3:
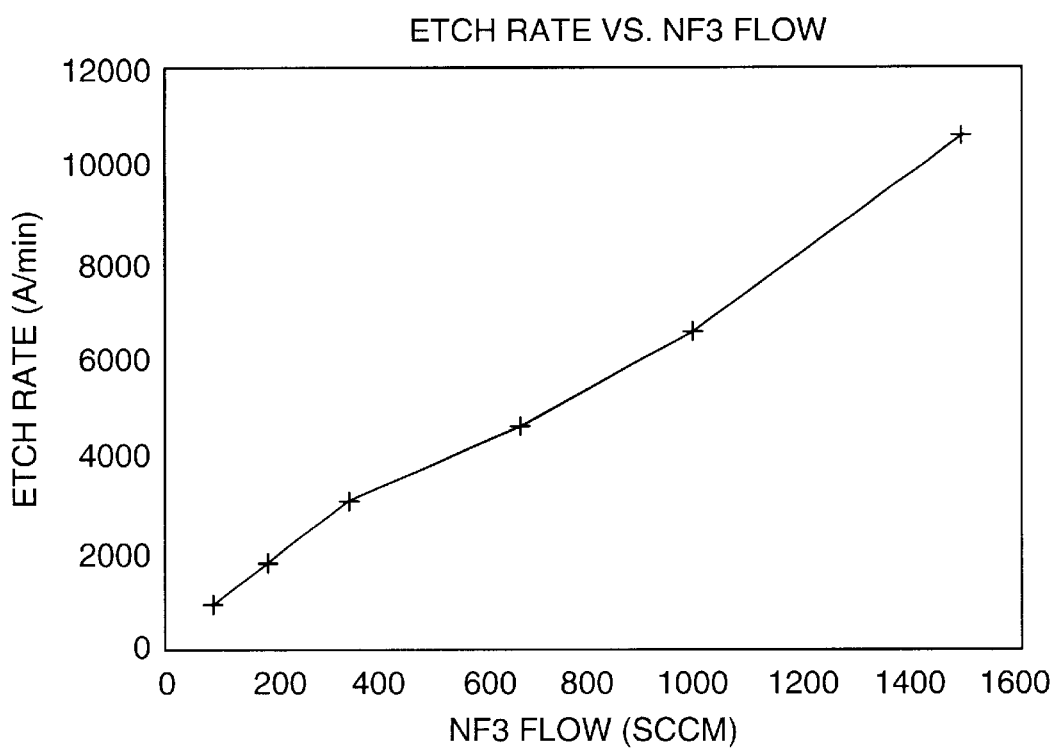
FIG. 3 illustrates a plot of etch rate of thermal silicon dioxide as a function of $NF_3$ feed gas flow rate, using the toroidal low-field plasma source that embodies the invention.

FIG. 3 illustrates a plot of etch rate of thermal silicon dioxide as a function of $NF_3$ feed gas flow rates using the toroidal low-field plasma source of the invention. The toroidal low-field plasma source 10 was configured as a downstream atomic fluorine source. The power absorbed by the plasma was approximately 3.5 kW.

Figure 4:
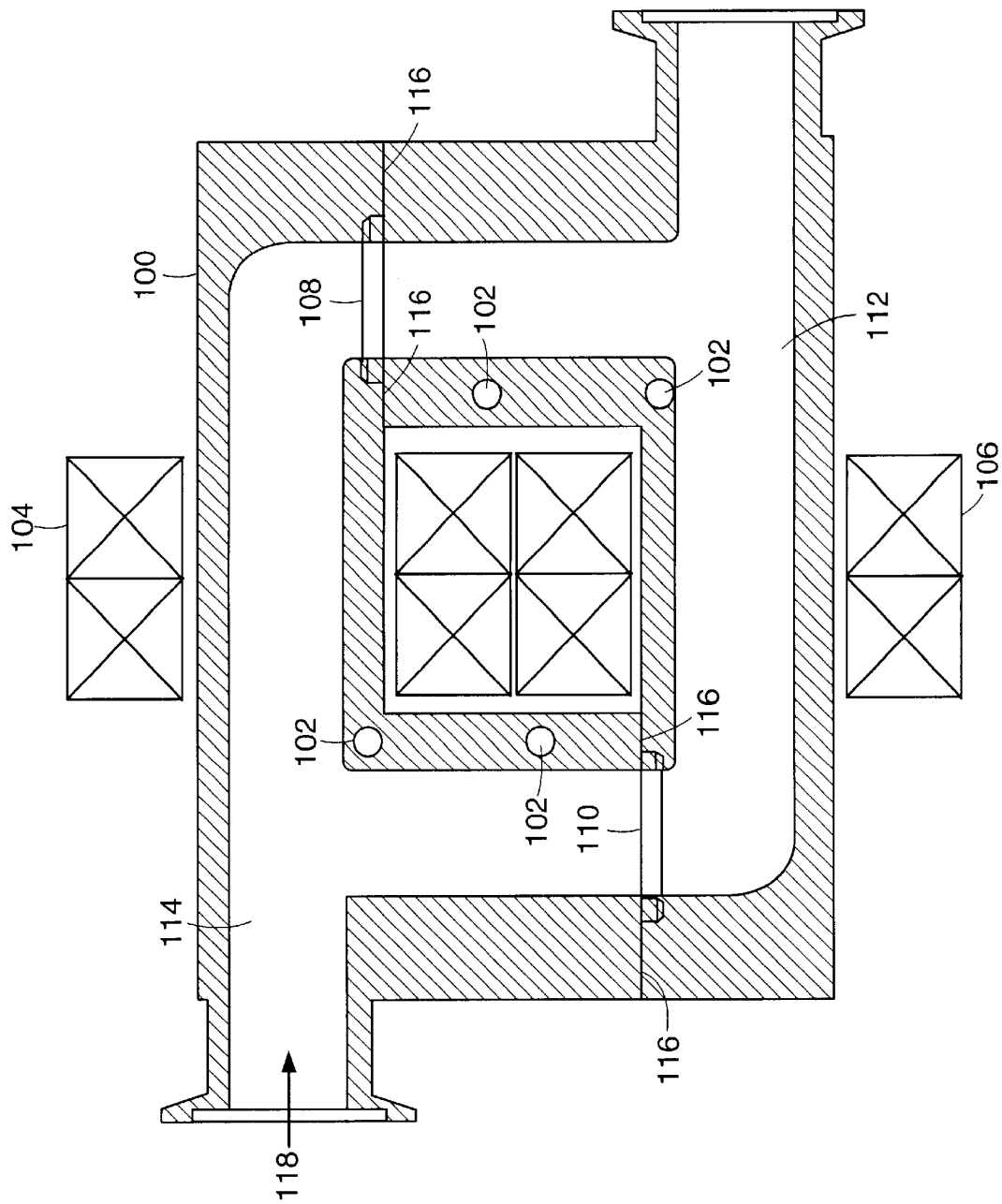
FIG. 4 is a cross-sectional schematic representation of a metallic plasma chamber that can be used with the toroidal low-field plasma source described in connection with FIG. 1.

FIG. 4 is a schematic representation of a metallic plasma chamber 100 that can be used with the toroidal low-field plasma source described in connection with FIG. 1. The plasma chamber 100 can be formed from a metal such as aluminum, copper, nickel and steel. The plasma chamber 100 can also be formed from a coated metal such as anodized aluminum or nickel plated aluminum.

As shown, a first and a second high permeability magnetic core 104, 106 surround the plasma chamber 100. The magnetic cores 104, 106 are part of the transformer 12 of FIG. 1. As described in connection with FIG. 1, each of the first and the second core 104, 106 induce a potential inside the chamber 100 that forms a plasma which completes a secondary circuit of the transformer 12. Only one magnetic core is required to operate the toroidal low-field plasma source.

Applicants have discovered that an inductively-driven toroidal low-field plasma source can be made with a metallic plasma chamber. Prior art inductively coupled plasma sources use plasma chambers formed from dielectric material so as to prevent induced current flow from forming in the plasma chamber itself. The plasma chamber 100 of this invention includes at least one dielectric region that electrically isolates a portion of the plasma chamber 100 so that electrical continuity through the plasma chamber 100 is broken. The electrical isolation prevents induced current flow from forming in the plasma chamber itself.

The plasma chamber 100 includes a first and a second dielectric region 108, 110 that prevents induced current flow from forming in the plasma chamber 100. The dielectric regions 108, 110 electrically isolate the plasma chamber 100 into a first region 112 and a second region 114. Each of the first region 112 and the second region 114 is joined with a high vacuum seal to the dielectric regions 108, 110 to form the plasma chamber 100. The high vacuum seal can include an elastomer seal or can be formed by a permanent seal such as a brazed joint. In order to reduce contamination, the dielectric regions 108, 110 can be protected from the plasma. The dielectric regions 108, 110 can include a dielectric spacer separating mating surface 116 of the plasma chamber 100, or can be a dielectric coating on the mating surface 116.

In operation, a feed gas flows into an inlet 118. As described in connection with FIG. 1, each of the first core 104 and the second core 106 induce a potential inside the plasma chamber 100 that forms a plasma which completes a secondary circuit of the transformer 12. Note that only one magnetic core is required to operate the toroidal low-field plasma source.

Figure 5:
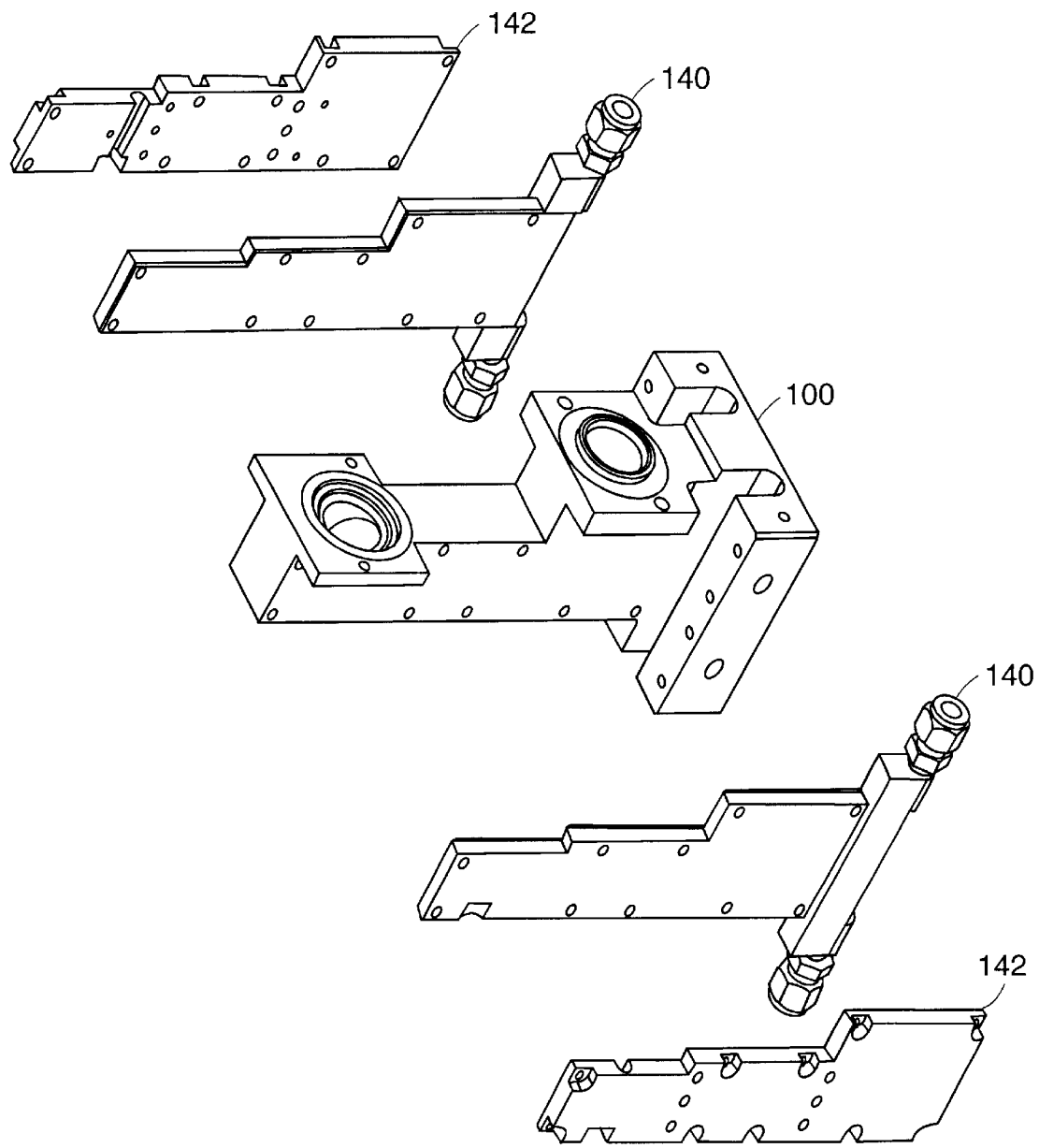
FIG. 5 is a schematic representation of a plasma chamber that is cooled by cooling plates through which a circulating cooling fluid flows.

The plasma chamber 100 can be cooled by a circulating fluid in order to operate at high continuous electric power. In one embodiment, the plasma chamber 100 includes inbedded cooling channels 102 for passing a fluid that controls the temperature of the plasma chamber 100, as illustrated in FIG. 4. In another embodiment, the cooling fluid flows inside one or more cooling plates 140 which are mechanically attached and thermally bonded to the plasma chamber 100, as illustrated in FIG.5. FIG. 5 shows one half of a plasma chamber and cooling plates to be assembled to the sides of the plasma chamber. Although this embodiment can be more complicated, it allows different materials to be used to make the plasma chamber 100 and the cooling plates 140. By avoiding the contact between the cooling fluid and the plasma chamber 100, the material for the plasma chamber 100 needs to be compatible only with the reactive plasma. Mechanically attaching the cooling plates 140 to the plasma chamber 100 as illustrated in FIG. 5 minimizes the possibility of contamination of the plasma chamber 100. For example, the plasma chamber 100 can be made of aluminum, and the cooling fluid can be water. The aluminum chamber can be eroded by water under certain conditions if it is in contact with water. However, by providing cooling water in a cooling plate 140 made of a water-compatible material, the aluminum plasma chamber 100 can be cooled with water. Alternatively, cooling plates 140 or cooling lines made of a material compatible with a cooling fluid can be bonded or brazed to the plasma chamber 100.

The use of metal or coated metal chambers in toroidal low-field plasma sources is advantageous because some metals are highly resistant to certain chemicals commonly used in plasma processing, such as fluorine based gases. In addition, metal or coated metal chambers can have higher thermal conductivity at higher temperatures than dielectric chambers and, therefore, can generate higher power plasmas.

Figure 6:
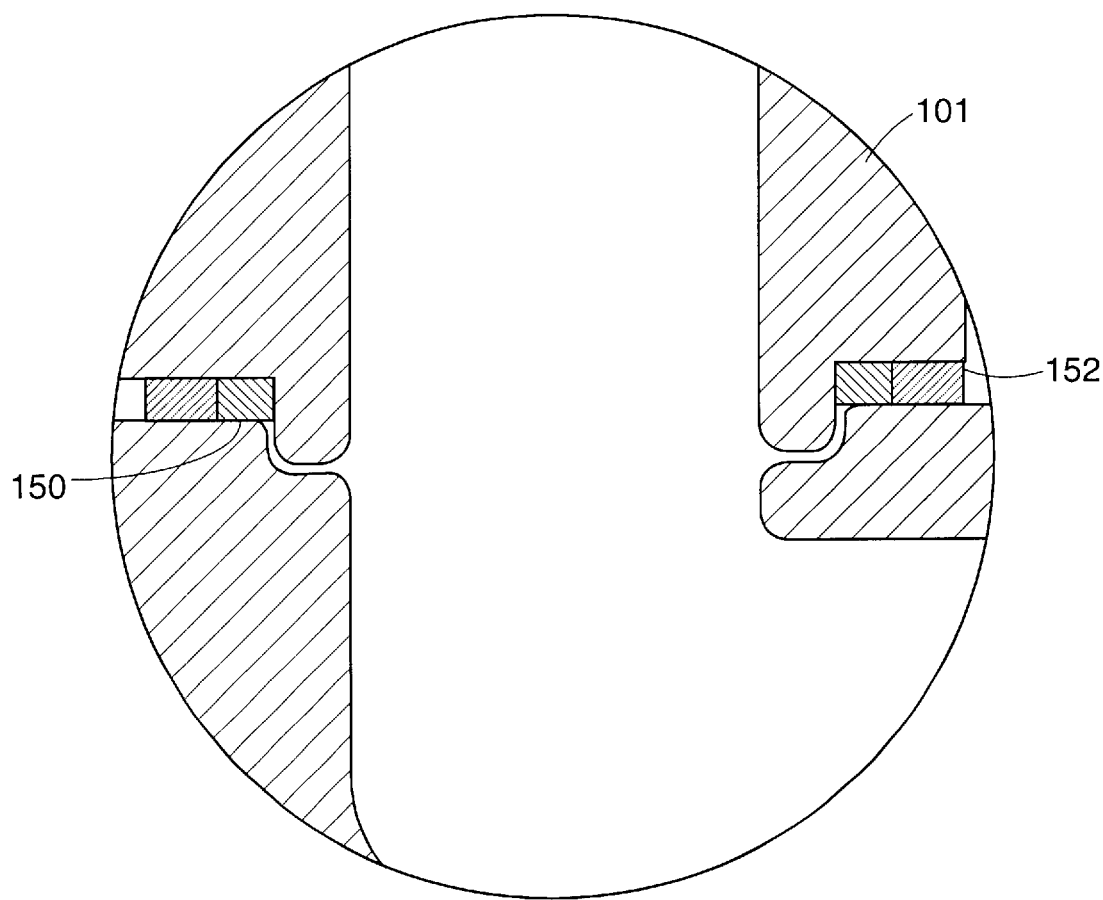
FIG. 6 is a cross-sectional schematic representation of a dielectric spacer suitable for the dielectric regions illustrated in FIG. 4 that prevent induced current flow from forming in the plasma chamber.

FIG. 6 is a schematic representation of a dielectric spacer 150 suitable for the dielectric regions illustrated in FIG. 4 that prevent induced current flow from forming in the plasma chamber 100. In this embodiment, a high vacuum seal 152 is formed outside the dielectric spacer 150. The dielectric region is protected from the plasma by protruded chamber wall 101.

Figure 7:
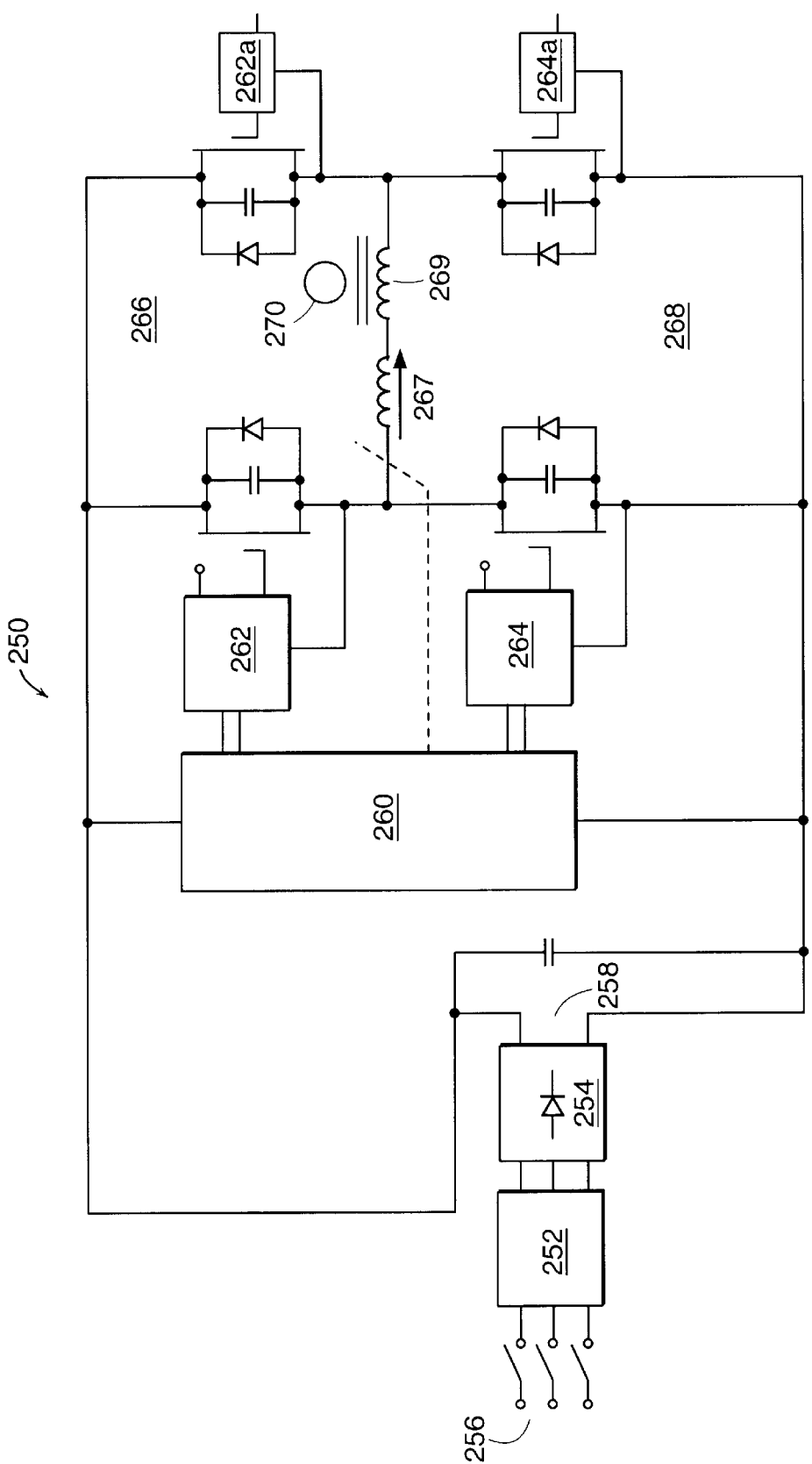
FIG. 7 is a schematic block diagram of a solid state switching power supply that includes the one or more switching semiconductor devices of FIG. 1.

FIG. 7 is a schematic block diagram of a solid state switching power supply 250 that includes one or more switching semiconductor devices of FIG. 1. Applicants have discovered that switching semiconductor devices can be used to directly drive the primary winding of a power transformer that couples electromagnetic energy to a plasma so as to form a secondary circuit of the transformer.

The use of a switching power supply in a toroidal low-field plasma source is advantageous because switching power supplies are much less expensive and are physically much smaller in volume and lighter in weight than the prior art RF and microwave power supplies used to power plasma sources. This is because switching power supplies do not require a line isolation circuit or an impedance matching network.

The present invention can use any switching power supply configuration to drive current in the primary winding 18 shown in FIG. 1. For example, referring to FIG. 7, the switching power supply 250 can include a filter 252 and a rectifier circuit 254 that is coupled to a line voltage supply 256. An output 258 of the filter 252 and the rectifier circuit 254 produces a DC voltage which is typically several hundred volts. The output 258 is coupled to a current mode control circuit 260.

The current mode control circuit 260 is coupled to a first 262, 262a and a second isolation driver 264, 264a. The first isolation driver 262, 262a and the second isolation driver 264, 264a drive a first pair of switching transistors 266 and a second pair of switching transistors 268. The switching transistors 266, 268 can be IGBT or FET devices. The output of the first pair of switching transistors 266 and the second pair of switching transistors 268 can have numerous waveforms including a sinusoidal waveform. The output of the switching transistors 267 is coupled by the primary winding and the magnetic core 269 to the toroidal plasma 270 which forms the secondary circuit of the transformer.

Figure 8:
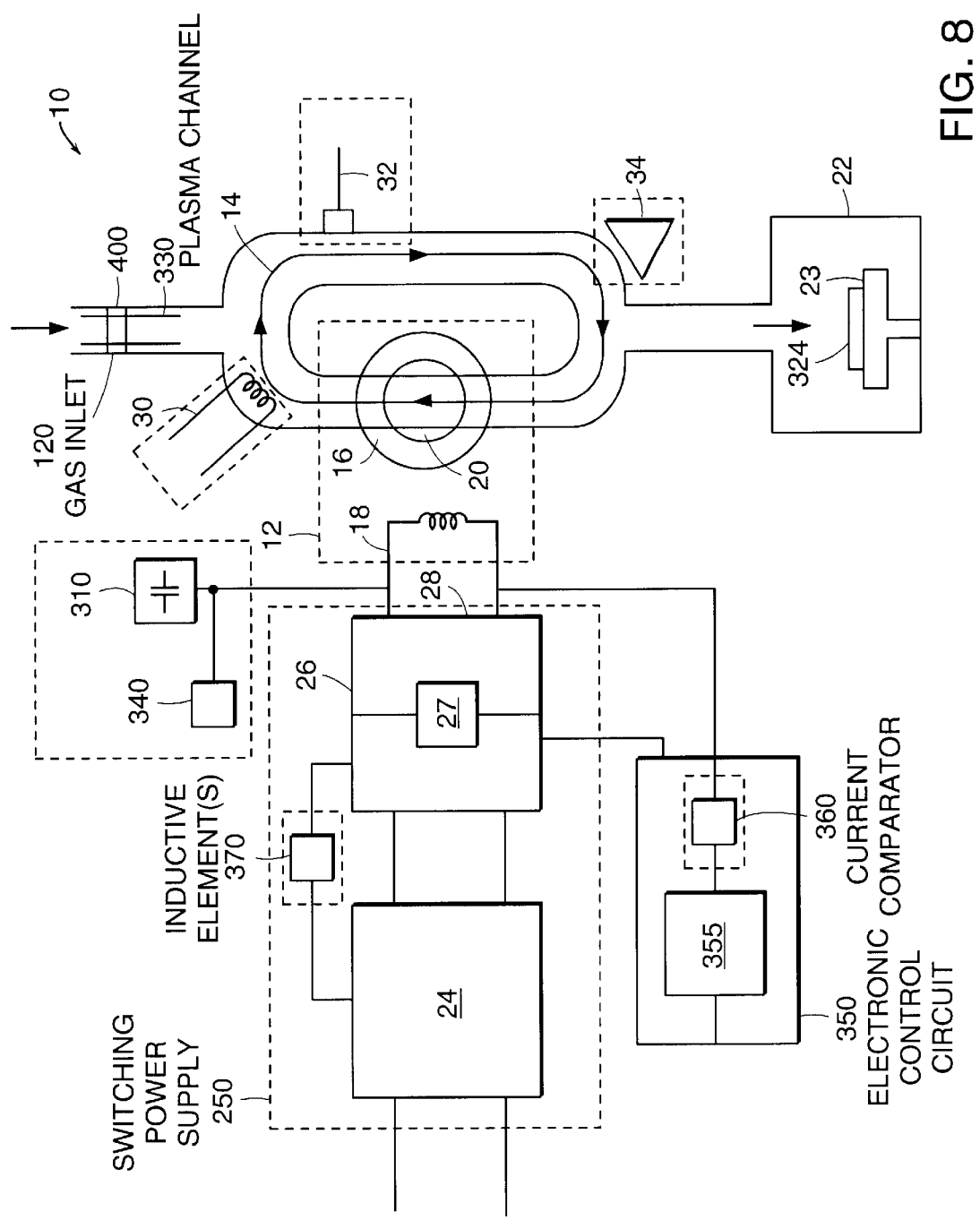
FIG. 8 is a schematic representation of an embodiment of a toroidal low-field plasma source of the present invention, including an ignition control circuit and a power control circuit.

In one embodiment, the plasma source 10 includes an ignition control circuit, which allows the plasma source 10 to be ignited within a wider range of gas conditions than generally allowed by prior art plasma sources. The ignition control circuit raises the voltage of the primary winding of the transformer during ignition significantly above its normal operation voltage, and energizes a free charge generator to provide initial ionization events to assist ignition. The ignition control circuit also controls the current of the switching power supply to protect the switching power supply 250 and other circuit components during ignition. Referring to FIG. 8, in one embodiment, the ignition control circuit includes the electronic control circuit 350, a resonance capacitor 310, and a switching device 340. The electronic control circuit 350 and the resonance capacitor 310 are in electrical communication with the primary winding 18 and the switching power supply 250. An electric switch 340 switches the resonance capacitor 310 on and off from the primary winding 18 and the switching power supply 250. The electric switch 340 can be a mechanical switch, or a solid state switch.

In a preferred embodiment, the resonance capacitor 310 is connected in series with the primary winding 18 and the switching power supply 250 so as to form a resonant circuit at the switching frequency of the switching power supply 250. The resonant circuit increases the voltage on the primary winding 18 to a resonance voltage. The resonance voltage can be higher by a factor of between 1 and 10 times the normal operating voltage supplied by the switching power supply 250.

In operation, the electric voltage applied to the primary winding 18 is increased to the resonance voltage prior to and during the ignition of the plasma 14, by switching in the resonance capacitor 310 with the switching device 340.

Figure 9:
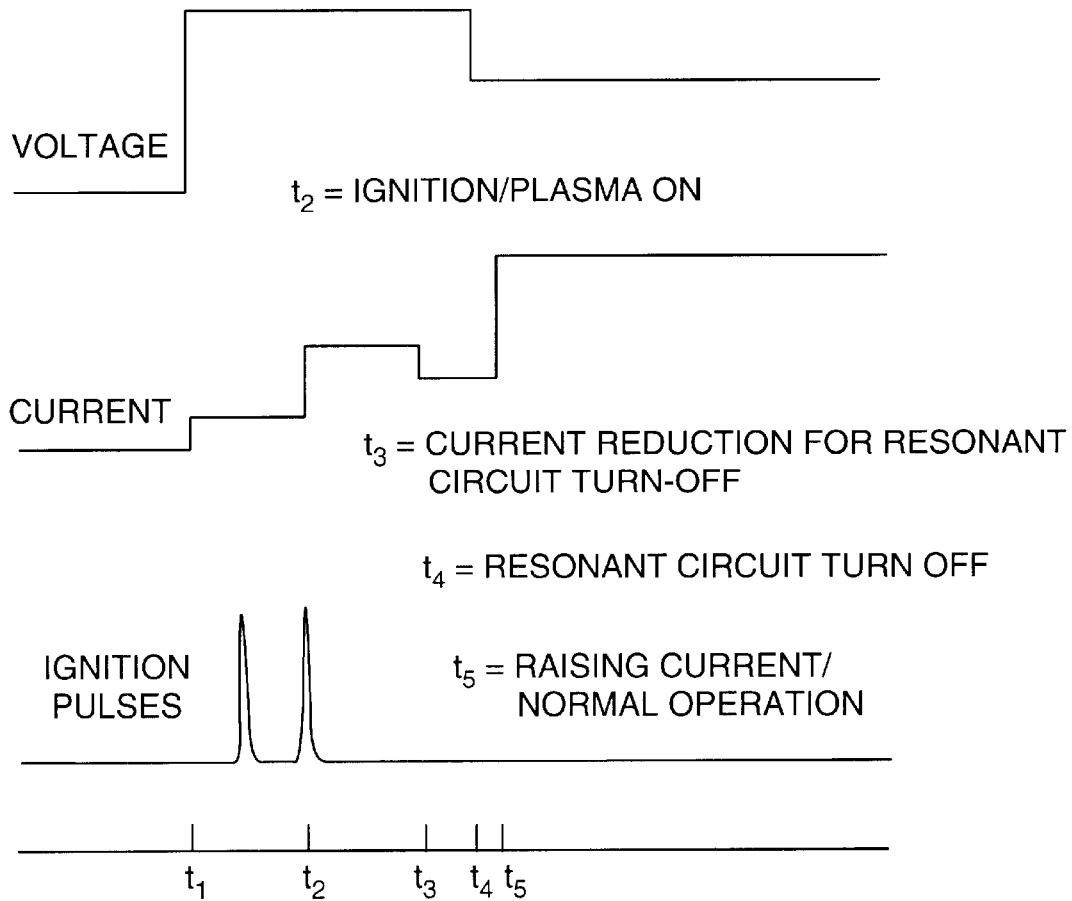
FIG. 9 illustrates a plot of the voltage, current, and the ignition pulse voltage as a function of time for igniting a plasma in the plasma chamber with an ignition control circuit constructed according to the present invention.

FIG. 9 illustrates the time sequences for igniting a plasma 14 in the chamber 20, using the ignition control apparatus of the present invention. At time $t_1$, the resonant circuit is turned on, so that the high resonance voltage is applied to the primary winding 18 of the transformer 12. The high resonant voltage on the primary winding 18 increases the electric field in the plasma channel to above the breakdown electric field of the gas in the channel. Simultaneously, free charge generator 32 is energized to produce initial ionization events. Switching in a high resonance voltage to the primary winding 18 is advantageous because it utilizes the transformer 12 as a resonant element and avoids the use of costly and cumbersome impedance matching network.

The electronic control circuit 350 in FIG. 8 also regulates current in the primary winding 18 during ignition. The current is controlled at different levels during various phases of the ignition cycle to protect the switching power supply 250 as well as other circuit components. While the resonant voltage is on the primary winding 18, the current is regulated at a level that allows generation of a sufficiently high resonance voltage while still protecting the switching power supply 250. The current regulation can be provided by the control circuit 350 and by current-limiting components in the resonant circuit itself. After plasma breakdown at time $t_2$, the resonant capacitor 310 is ready to be switched off to turn the plasma source to the normal operation mode. The current is then changed at time $t_3$ to a level appropriate for switching off the resonant capacitor 310. The switching device 340 switches off the resonance capacitor 310 at time $t_4$ and the circuit thereby becomes non-resonant. Finally, at time $t_5$ subsequent to the switching off of the resonant circuit from the primary winding 18, the control circuit 350 raises the electric current to the primary winding 18 to a steady-state level suitable for normal operation, ending the ignition sequence.

In an alternative embodiment, the resonance capacitor 310 is connected to the primary winding so as to form a resonant circuit at a predetermined frequency. The control circuit 350 controls ignition of a plasma 14 in the chamber 20 by regulating the cycle rate of the switching power supply 250. The control circuit tunes the cycle rate of the switching power supply 250 to the predetermined resonant frequency prior to and during ignition, thereby raising the voltage on the primary by a factor of between 1 to 10 times the voltage supplied by the switching power supply 250. The control circuit 350 maintains the current in the primary below the rating of the switching power supply 250 during the resonance voltage phase. After ignition of the plasma, the control circuit 350 tunes the cycle rate of the switching power supply 250 away from the resonance frequency, so that the voltage on the primary is brought back to the initial voltage supplied by the switching power supply 250. A free charge generator can also be used to provide initial ionization events to assist ignition.

In one embodiment, the plasma source 10 further includes a power control circuit, by which the electric power delivered to the plasma is determined by an external command signal. In another embodiment, the plasma source 10 includes a power control circuit, by which the electric power delivered to the plasma is automatically adjusted based on the size of the plasma load, thereby saving energy.

Figure 10A:
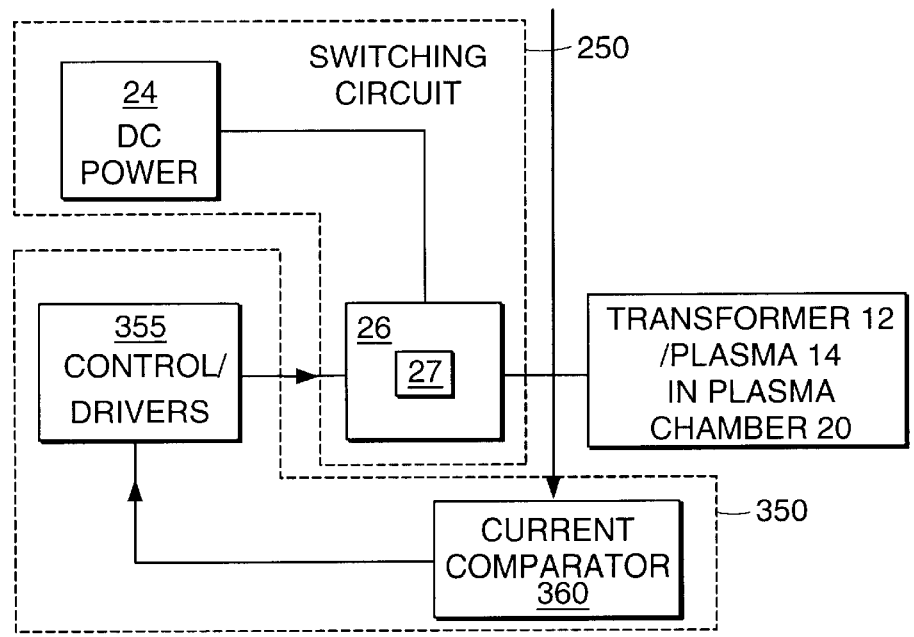
FIG. 10(a) is a block diagram of an embodiment of a power control circuit of the plasma source of the present invention.

FIG. 10(*a*) is a schematic diagram of an embodiment of a power control circuit, in which the output power of the plasma source is controlled by varying the duty cycle of the switching power supply 250. In one embodiment, the power control mechanism comprises an electronic control circuit 350 that includes a current comparator 360 and a controlling device such as a microprocessor 355. The plasma 14 and the power transformer 12 form a load on the switching power supply 250.

Figure 10B:
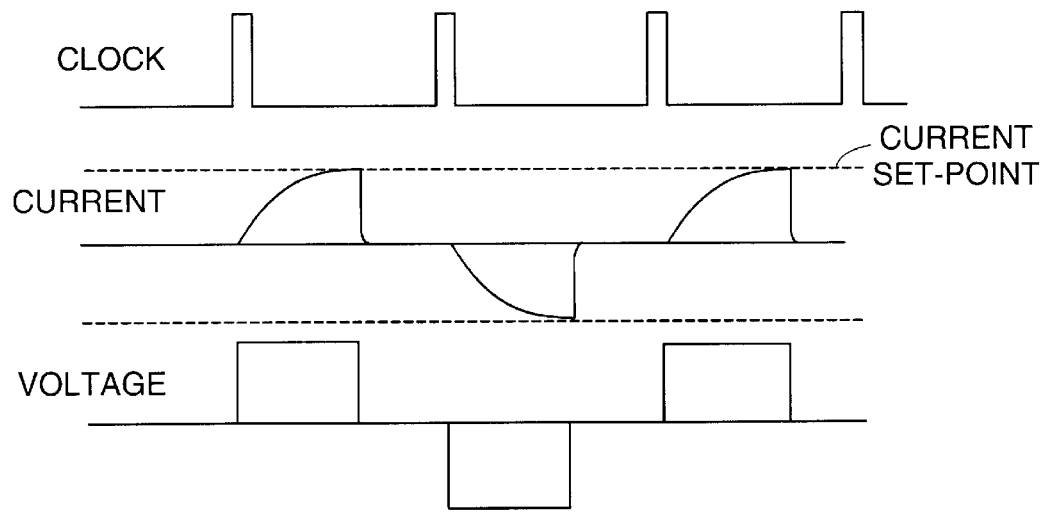
FIG. 10(b) is a graph illustrating the relationship between the current and voltage in the primary winding with respect to the fixed clock cycle of the switching semiconductor device shown in FIG. 10(a).

In operation, the control circuit 350 varies the duty cycle of the switching power supply 250, thereby controlling power delivered to the plasma load. Electric current feedback from the primary winding 18 of the transformer is used to control the duty cycle of the switching power supply 250. FIG. 10(b) includes a graph of the current in the primary and the voltage on the primary, plotted against the fixed clock cycles of the switching power supply 250. The microprocessor 355 sets a maximum electric current set-point to the primary winding 18. In each cycle of power switching, the current comparator 360 measures the electric current to the primary winding 18, and compares the measured current with the maximum current set-point.

Once the set-point is reached, the current comparator 360 sends a signal to the switching semiconductor device 27 in the switching circuit 26 to turn off the cycle. As seen in the graph for the current and the voltage in FIG. 10(b), the switching semiconductor device remains in off state until the next clock cycle. As a consequence, voltage on the primary is also turned off until the next clock cycle.

For a given induced voltage in the plasma 14, the electric current rises with a higher rate for a smaller plasma load, and consequently reaches the current set-point at an earlier time for a smaller plasma load. The duty cycle of the switching power supply circuit 100 is therefore varied, whereas the clock cycle of the switching power supply remains fixed. With a fixed clock cycle and a variable power-on duty cycle, the average output power of the switching power supply 250 is automatically controlled by the size of the plasma load. The source power automatically adjusts between about 100 W and 10 kW, depending on the size of the plasma load.

Alternatively, the amplitude (and/or the peak value) of the primary current in one or more cycles can be fed back to the control circuit. The current is compared with the current set point, and a power duration of the next cycle is determined based on the difference between the measured current and the set point. By setting a duty cycle based on the current in one or more previous cycle, the averaged current of the one or more previous cycles can be used to determine the next duty cycle. This reduces the fluctuations that can be encountered when measuring the peak current in a single cycle. This method is practical as long as the duration of the signal averaging is short compared with the time scale of plasma impedance change.

Figure 11A:
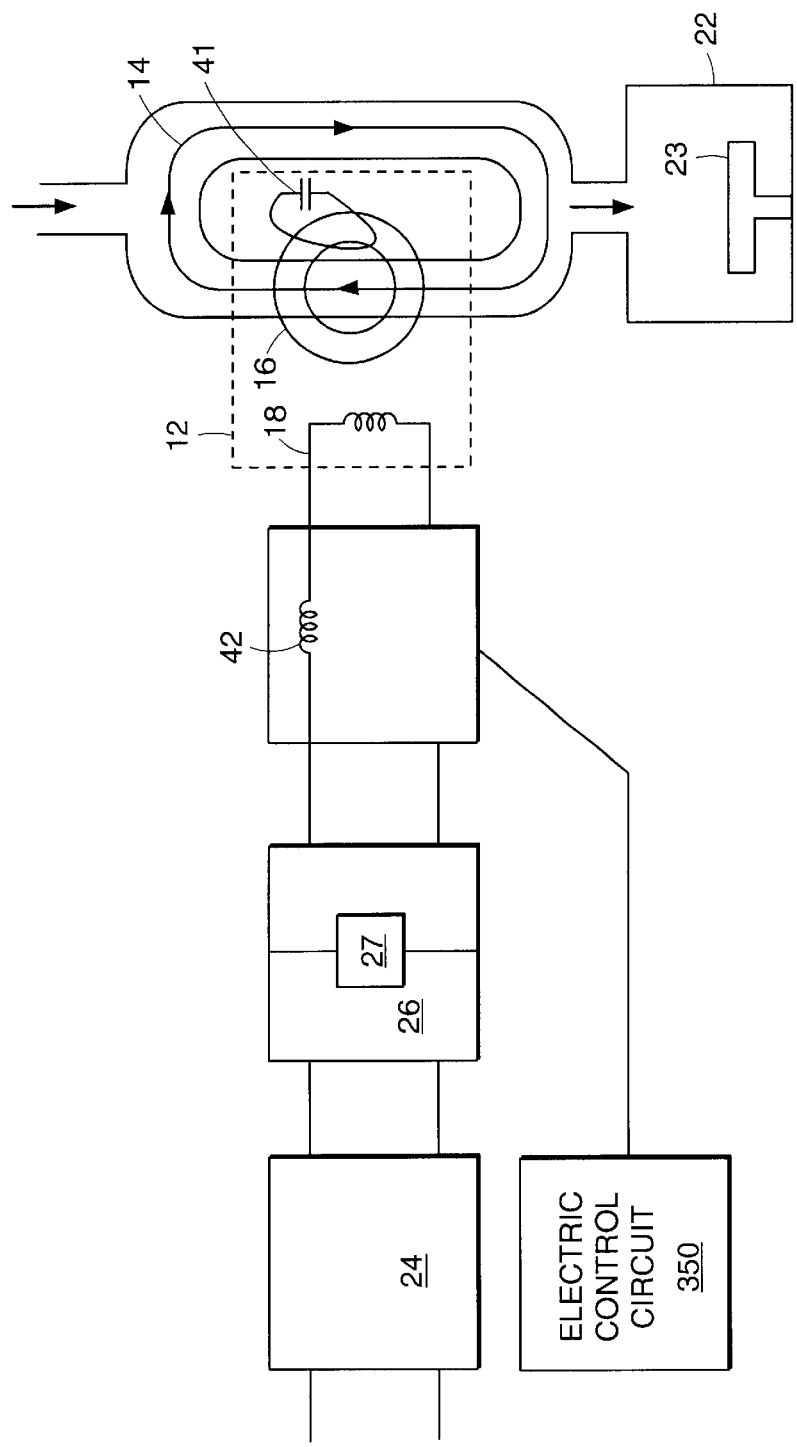
FIG. 11(a) is a schematic diagram of an embodiment of a resonant electric circuit for providing a constant-amplitude plasma current to the toroidal low-field plasma source of the invention.
Figure 11B:
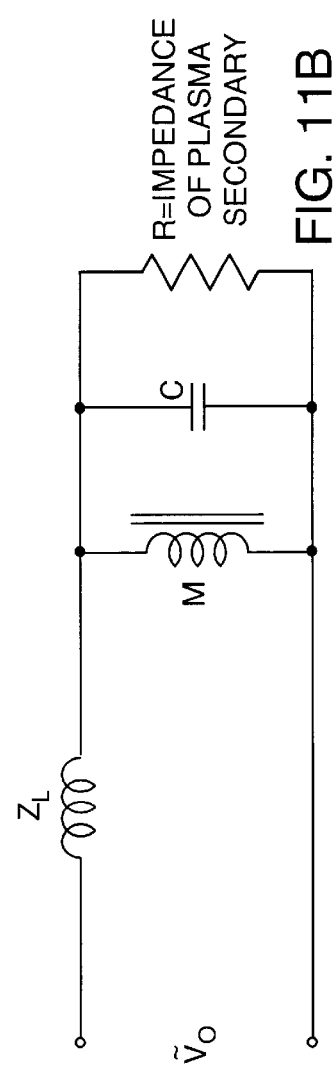
FIG. 11(b) is an equivalent circuit of the constant current source.

In another embodiment, the power control circuit includes a resonant circuit as illustrated in FIGS. 11(a) and 11(b) to maintain a nearly-constant plasma current in the plasma chamber 20. FIG. 11(a) shows a schematic of the circuit arrangement and FIG. 11(b) shows its equivalent circuit. A capacitor 41 is connected in parallel with the plasma secondary 14 at the secondary of the transformer. The capacitance is selected so that it is in resonance with the resonant inductor 42 at the switching frequency. Part of the resonant inductor 42 can be the leakage inductance of the main transformer 16. Under resonance condition the electric current through the plasma is determined by $V_0/Z_L$, the ratio of the switch power supply voltage and the impedance of the resonant inductance at the switching frequency. Since the switching power supply voltage $V_0$ and impedance $Z_L$ are independent of the plasma load, the amplitude of the electric current through the plasma is nearly independent of the plasma load. The resonant circuit adjusts the voltage on the primary of the transformer to maintain a constant current through the plasma.

Figure 12A:
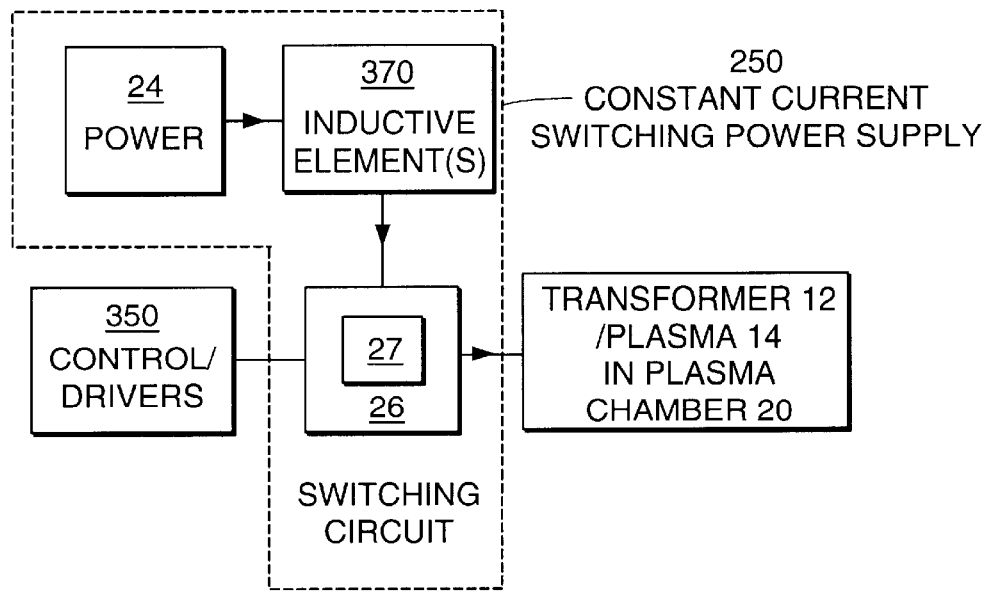
FIG. 12(a) is a schematic diagram of an embodiment of a constant-current switching power supply connected in series with an inductive element for use in the present invention.

In another embodiment, the power control mechanism comprises a constant-current RF switching power supply 250, as shown schematically in FIG. 12(a). The constant-current RF switching power supply 250 of FIG. 12(a) includes an inductive element 370 connected in series with the plasma chamber 20 and the transformer 12. The plasma chamber 20 and the transformer 12 form a load on the constant-current switching power supply 250. The power control circuit of FIG. 12(a) also includes a control circuit 350 which controls the switching circuit 26, thereby controlling the current through the inductive element 370 as well as the current through the load.

Figure 12B:
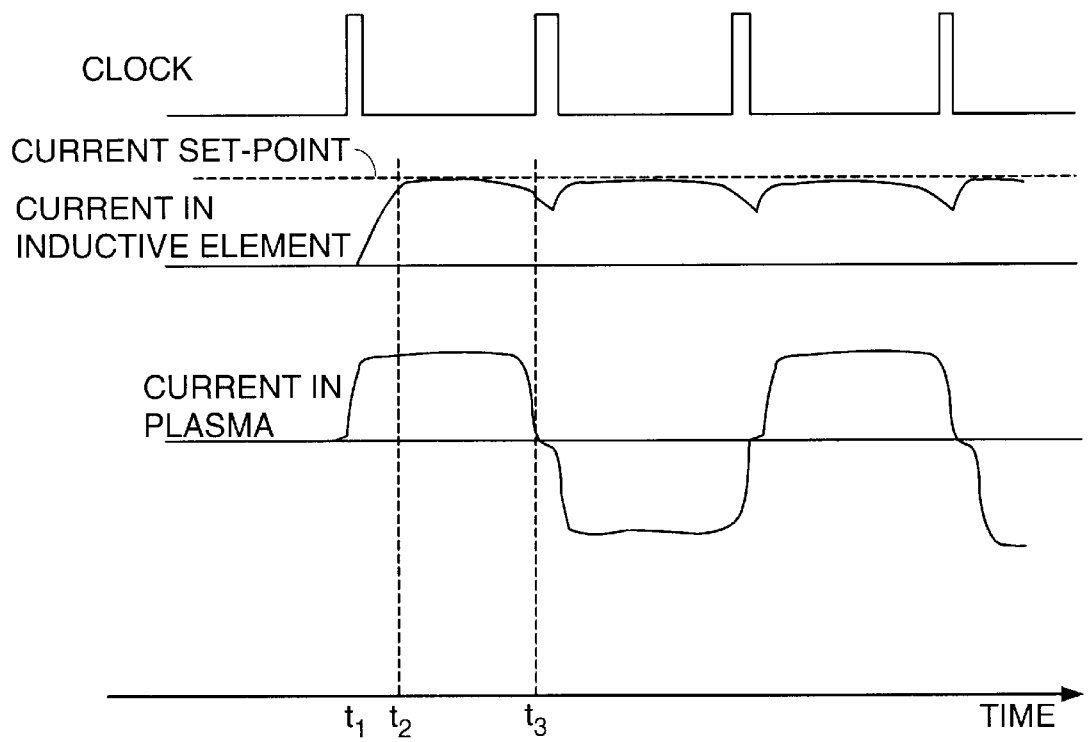
FIG. 12(b) is a graph illustrating the relationship between the current in the inductive element and the plasma current, and the fixed clock cycle of the switching semiconductor device shown FIG. 12(a).

In operation, at the beginning of each RF half cycle, the switching semiconductor device 27 drives current through the inductive element 370 without passing any current through the plasma load. The inductive element 370 is thereby energized. FIG. 12(b) includes a graph of the current through the inductive element and the current through the plasma load, plotted against the fixed clock cycles of the switching power supply 250. The inductive element 370 is energized between times $t_1$ and $t_2$ shown on the time line in FIG. 12(b). The energy stored in the inductive element 370 through the initial energizing phase is a substantial fraction of the total energy to be dissipated by the plasma source in a half cycle.

The control circuit establishes a maximum current set-point for the current through the inductive element 370. Once the inductor current reaches the set-point value, the switching semiconductor device 27 switches the inductor current onto the load, at time $t_2$ as indicated in the time line in FIG. 12(b). The inductive element 370 has enough energy stored in itself to enable it to maintain the current through the plasma load at close to the initial inductor current level. At the end of an RF half cycle, at time $t_3$, the switching semiconductor device 27 switches off the inductor current from the load. Current is once again driven through the inductive element 370 without going through the load, thereby reenergizing the inductive element 370 for the next half cycle. By having an energized inductive element connected in series with the primary winding 18 of the transformer 12 at the beginning of each RF half cycle, the voltage on the primary winding is self-adjusted to maintain a constant plasma current. Power is thereby adjusted based on the size of the load.

In one embodiment, the plasma source 10 further includes a gas mixing device 400 installed at the gas inlet 120 of the plasma source 10, as shown in FIG. 8. The purpose of the gas mixing device 400 is to create a gas flow pattern in the plasma channel which enhances the interaction between the feed gas and the plasma. Under conditions of high flow or high density of electronegative gases such as fluorine and oxygen, the plasma 14 in the plasma chamber 20 can not fill the entire chamber 20. When the plasma does not fill the entire plasma channel 330, a fraction of the feed gas can pass through the plasma chamber 20 without contacting the hot core of the plasma 14, resulting in lower dissociation and abatement efficiencies. A gas mixing device 400 enhances the interaction between the feed gases and the plasma 14, thereby improving the dissociation and abatement efficiencies of the plasma source 10.

Figures 3, 13A:
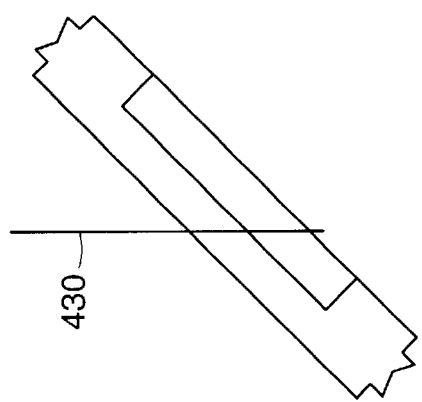
FIG. 13(a) illustrates of an embodiment of a swirl gas mixing device constructed according to the present invention.
Figures 2, 13A:
Figures 1, 13A:
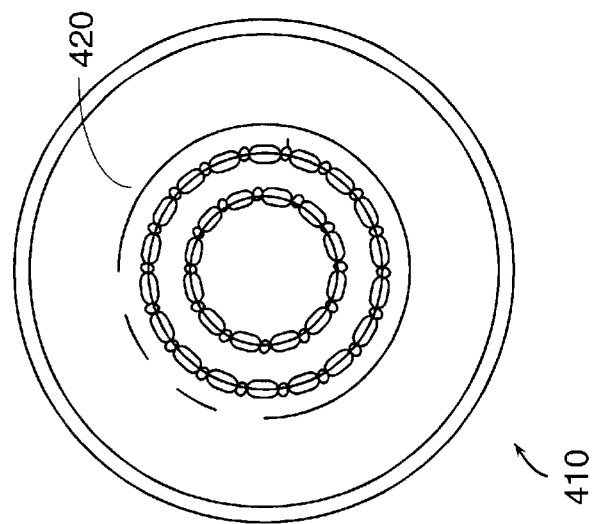

In one embodiment, the gas mixing device 400 is a swirl gas mixer plate 410 shown in FIG. 13(a). The swirl gas mixer plate 410 contains a number of concentric holes 420, which are aligned tangentially to the inner surface of the plasma channel 330 (shown in FIG. 8). Referring back to FIG. 13(a), the holes 420 are at an angle of between about 30 degrees to about 60 degrees relative to the axis 430 of the plasma channel. In operation, the swirl gas mixer plate 410 injects feed gas helically into the plasma chamber 20, creating a spiral flow and forcing the feed gas to mix and react with the plasma 14.

Figure 13B:
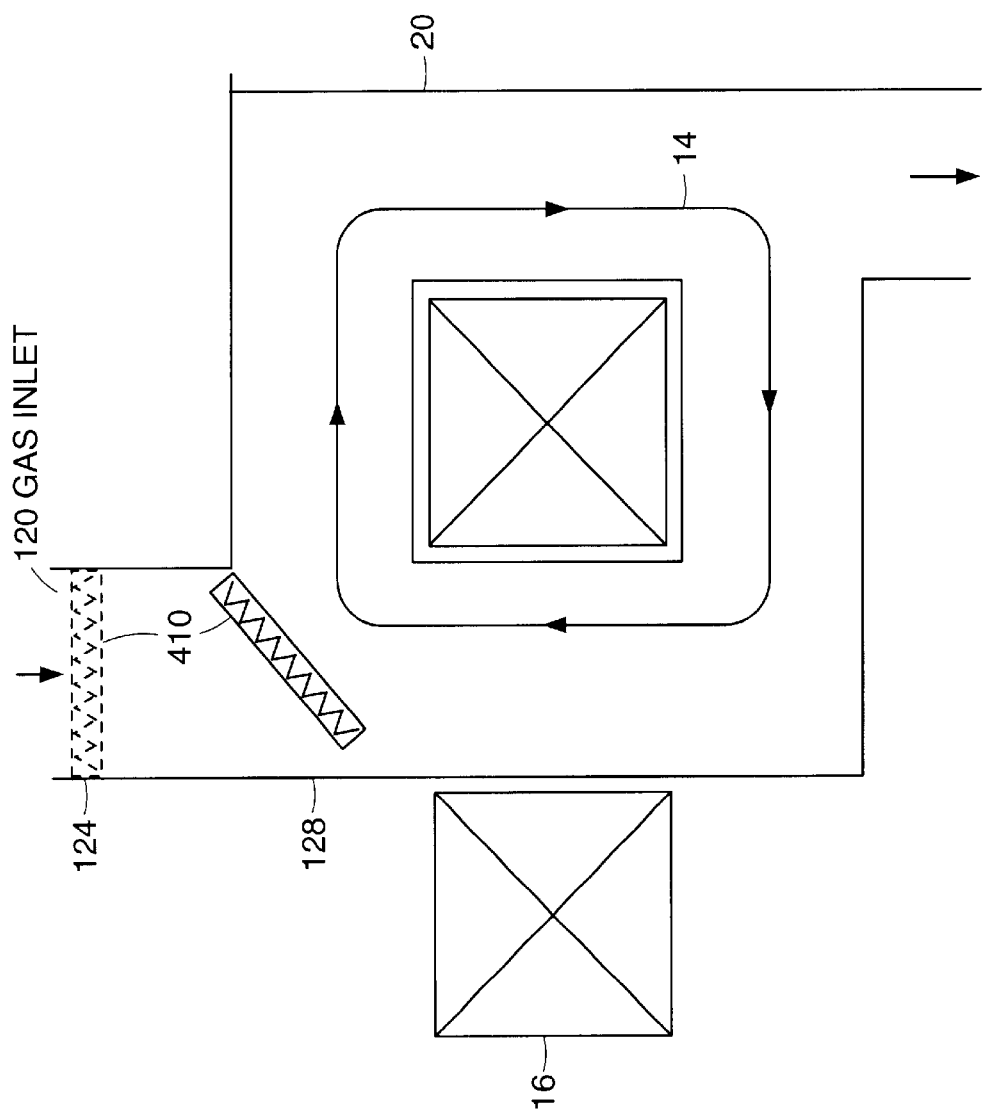
FIG. 13(b) is a schematic illustration of an embodiment of the installation of the swirl gas mixing device within the toroidal low-field plasma source.

In a plasma chamber having a geometry as indicated in FIG. 13(b), the swirl gas mixer plate can be installed at the position 128, which is symmetric to the two arms of the plasma channel 420 which intersect perpendicularly at gas inlet 120. By positioning the gas mixer plate symmetrically to the two arms of the plasma channel 420, the gas mixer plate 410 injects inlet gas evenly into the two arms of the plasma channel 420 while it creates a helical flow pattern that enhances the interaction between the inlet gas and the plasma. Measurements have shown a significant increase in the dissociation rate of inlet gases as well as an increase in the maximum gas flow rate that can be operated in the plasma source. Significant increases in dissociation rates have also been observed with the swirl gas mixer plate installed at position 124 as indicated in FIG. 13(b).

The toroidal low-field plasma source 10 of the present invention can be operated at a wider pressure range than generally allowed by prior art plasma sources, namely between about 1 millitorr and about one atmosphere. To help reduce the electric field needed for ignition, a noble gas (e.g. Ar) is introduced into the plasma chamber 20 and the pressure of the plasma chamber 20 is initially reduced to between 0.1 and 200 torr. After plasma ignition, reactive gases such as $O_2$, $NF_3$, and PFCs are added to the plasma chamber 20. The pressure is then adjusted to a desired level between about 1 millitorr and about one atmosphere.

Figure 14:
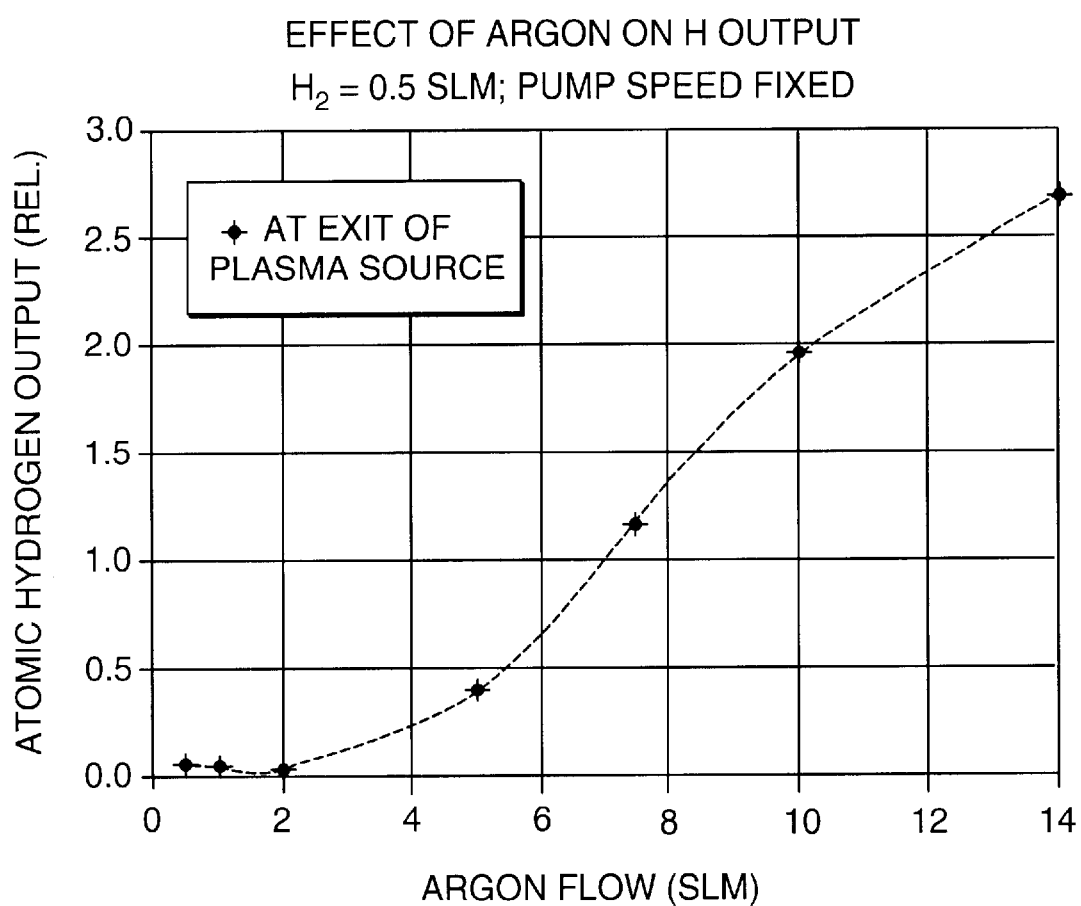
FIG. 14 illustrates a plot of atomic hydrogen output as a function of flow rate of argon carrier gas, using a toroidal low-field plasma source constructed according to the present invention.

The toroidal low-field plasma source 10 can be operated so as to increase the output of atomic species, such as atomic oxygen and hydrogen, by adding a noble gas to the inlet reactive gas. In operation, a noble carrier gas such as argon is added to a mixture of $O_2$ and $N_2$, or to a hydrogen gas, before the gases are fed to the plasma source 10. FIG. 14 shows output of atomic hydrogen measured at the exit of the plasma source, which increases with the flow rate of the argon carrier gas. Adding a noble carrier gas such as argon to the reactive gases can allow atomic species generated in the plasma source 10 to be more efficiently transported from the plasma source 10 to the process chamber 22, because collisions with the walls of the plasma chamber 20 are reduced. The flow rate of the noble carrier gas is substantially between 1 and 50 standard liters per minute.

Figure 15A:
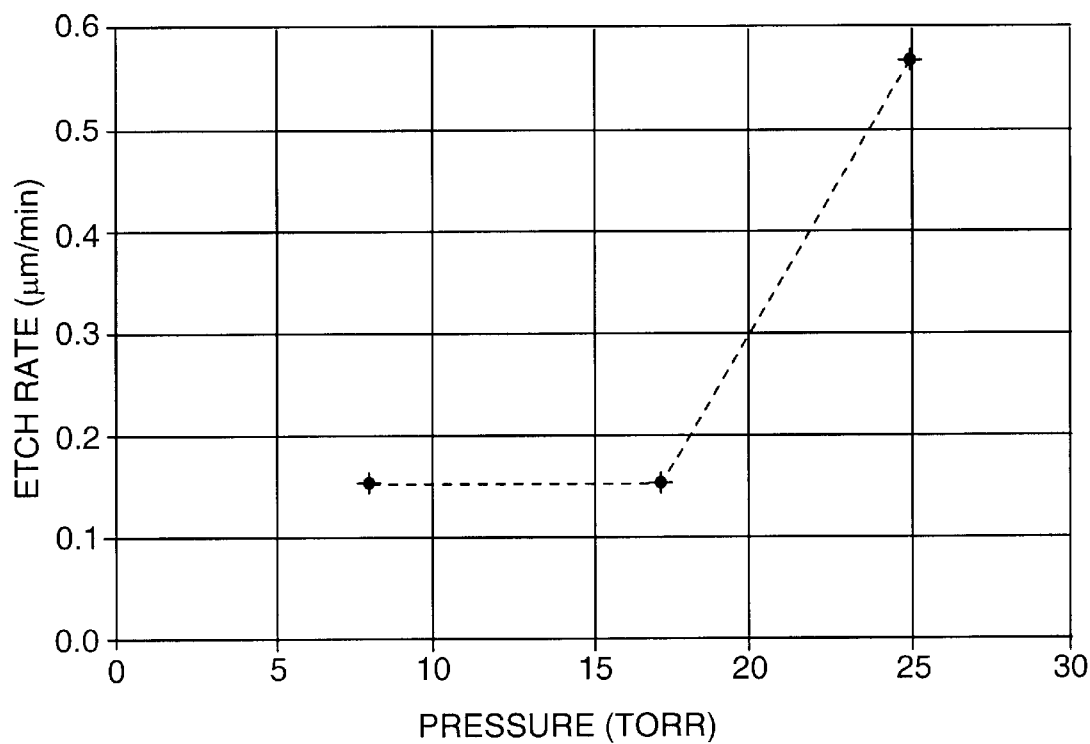
FIG. 15(a) and FIG. 15(b) illustrate plots of removal rates of photoresist as a function of gas pressure, using a toroidal low-field plasma source constructed according to the present invention.
Figure 15B:
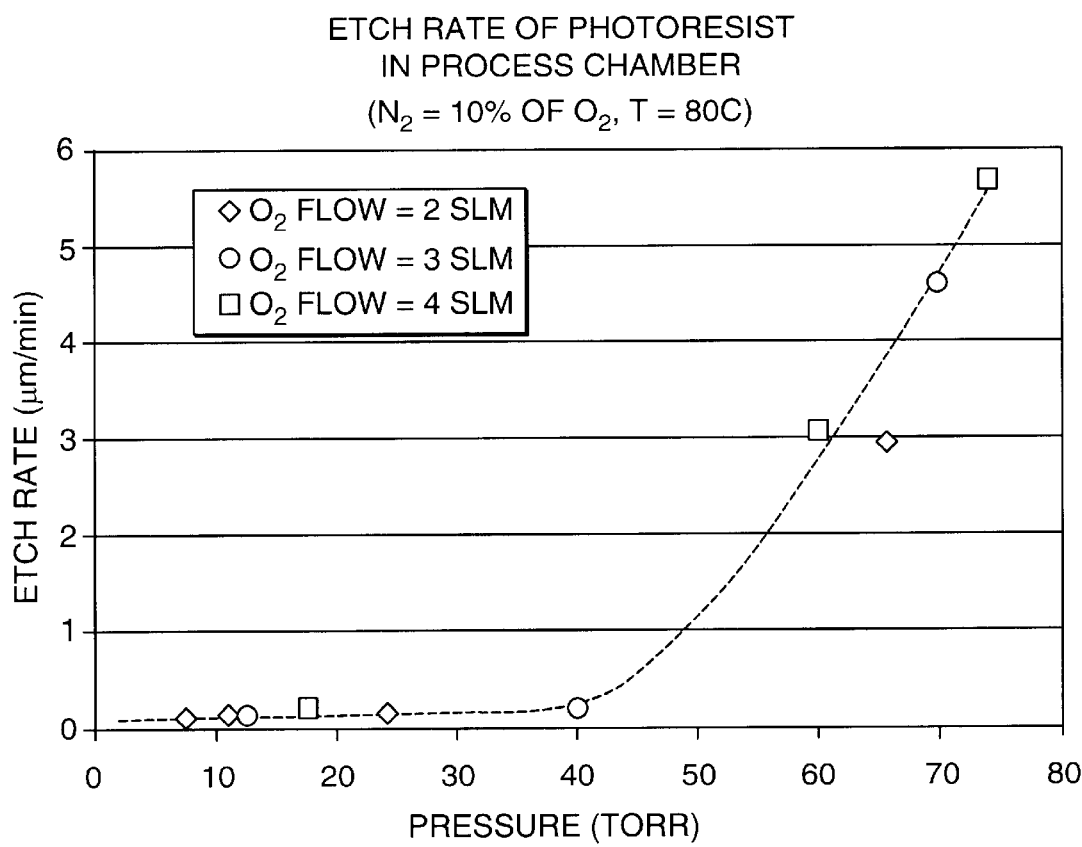

The toroidal low-field plasma source 10 can be operated so as to increase the etch rate of organic materials such as photoresists, by raising the process pressure to above 20 torr. A mixture of a noble gas with $O_2$ and $N_2$ is fed to the plasma source 10. In one embodiment, the noble gas is argon. The pressure of the process chamber 22 and the pressure of the plasma chamber 20 are then raised to above 20 torr. FIG. 15a shows the removal rates of photoresists as a function of the process pressure. The feed gas is a mixture of argon, $O_2$ and $N_2$. The removal rates of photoresists increase when argon is added to the $O_2/N_2$ plasma. The removal rates also increase when the pressure is raised. At the exit of the plasma source, significant increase of photoresist etch rate begins at gas pressure of 20–25 torr. On a photoresist wafer located further downstream of the plasma source in a process chamber, significant increase of etch rate begins at chamber pressure of 40–50 torr as shown in FIG. 15b. The increase in strip rates indicates higher densities of atomic oxygen and/or other activated oxygen-containing species. It can also involve activation of chemical reactions between molecular oxygen and photoresist at high concentrations of atomic oxygen.

The toroidal low-field plasma source 10 can be operated so as to abate gases that are toxic for humans, or harmful to the environment. In particular, the plasma source 10 can be used to abate perfluorocompounds (PFCs), which are highly stable and therefore difficult to be abated by thermal means. The hazardous molecules in a PFC can be broken down in a high density plasma source, and made to react with additive gases to form safe or scrubbable products which are subsequently treated with a scrubber.

For example, in operation, the toroidal low-field plasma source 10 can be installed between a process chamber 22 and a vacuum pump or between a turbo molecular pump situated at the chamber exhaust and a mechanical backing pump. Exhaust PFC gases from the process chamber 22 are mixed with oxygen and argon at or near the plasma source 10. The $O_2$ to carbon in the mixture is maintained at a ratio close to or greater than one. The gas mixture flows to the toroidal low-field plasma source 10, where the PFC and oxygen molecules are activated. The PFCs react to form $CO_2$ and scrubbable products such as F and $F_2$. In one embodiment, hydrogen gas or water vapor is added to the gas mixture to convert F and $F_2$ to HF in the scrubbable product. A scrubber positioned downstream of the plasma source 10 removes the scrubbable products such as F, $F_2$, HF, CFO, and $CF_2O$ from the gas stream.

The plasma source 10 can be operated at a pressure substantially between 1 millitorr and one atmosphere. A noble gas such as argon, in which a plasma is easily ignited, is used to lower the discharge voltage required in the toroidal plasma source 10. This avoids sputtering or erosion of the chamber walls, and reduces the burden on the power supply.

Figure 16:
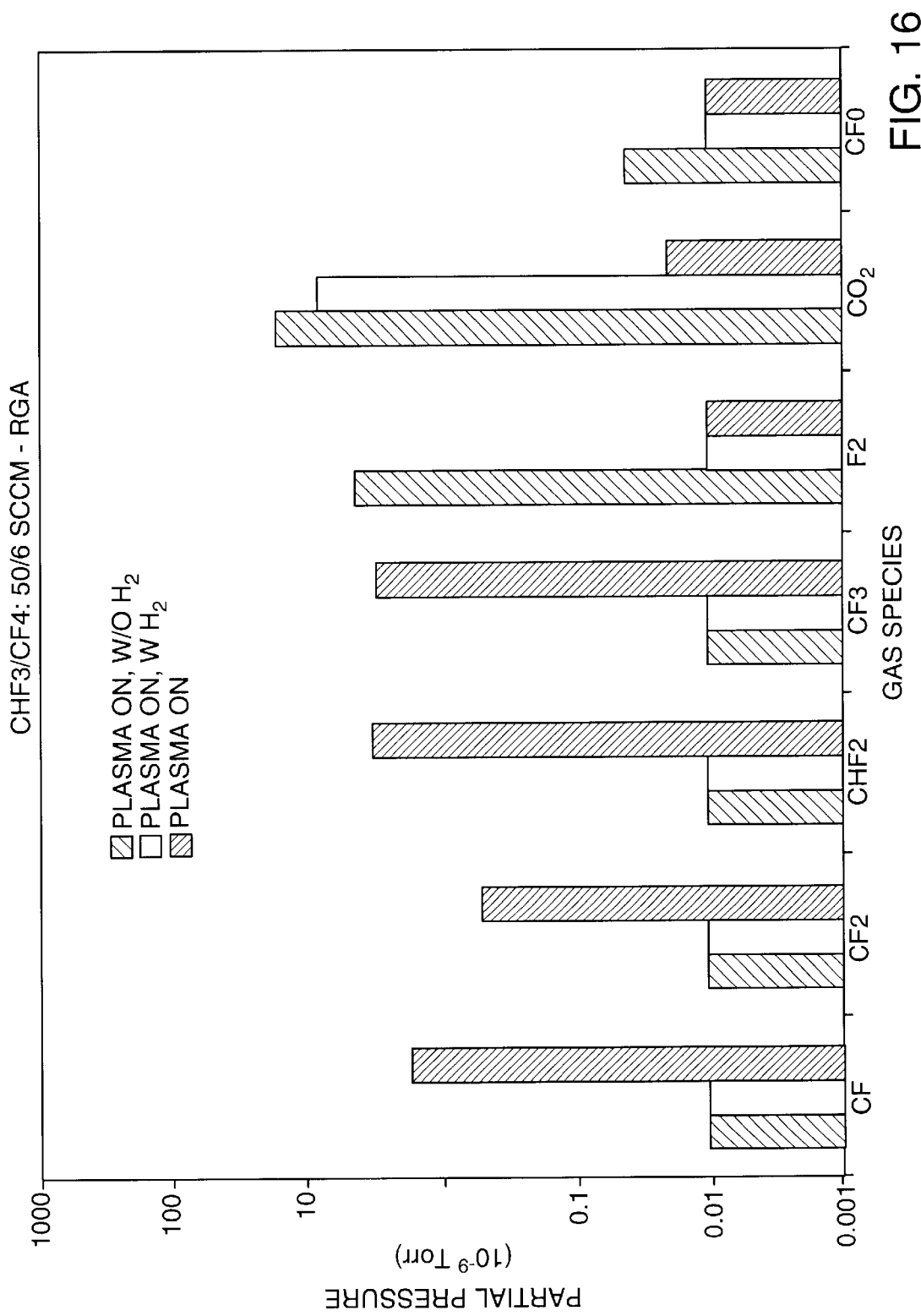
FIG. 16 illustrates a plot of the abatement of perfluoro compounds, using a an toroidal low-field plasma source constructed according to the present invention.

FIG. 16 illustrates a plot of the abatement results for PFCs, obtained with a toroidal low-field plasma source constructed according to the present invention. FIG. 16 shows that as the plasma is turned on, PFCs such as CF, $CF_2$, $CHF_2$, and $CF_3$ are reduced to levels below the instrument detection limit, and innert product $CO_2$ and scrubbable products such as $F_2$, and CFO are formed. FIG. 16 also shows that addition of hydrogen in the plasma enhances the production of the scrubbable products.

Equivalents

While the invention has been particularly shown and described with reference to specific preferred embodiments, it should be understood by those skilled in the art that various changes in form and detail can be made therein without departing from the spirit and scope of the invention as defined by the appended claims.

What is claimed is:

1. An apparatus for dissociating gases in a plasma comprising:
   a) a plasma chamber;
   b) a transformer having a primary winding and having a magnetic core surrounding a portion of the plasma chamber;
   c) a switching power supply in electrical communication with the primary winding;
   d) a resonance capacitor in electrical communication with the primary winding and the switching power supply, the resonance capacitor and the switching power supply forming a resonant circuit at switching frequency of the switching power supply, the resonant circuit outputting a resonance voltage on the primary winding; and
   e) an electronic control circuit in electrical communication with the primary winding and the switching power supply;
   wherein the control circuit maintains current in the primary winding at a first value while the resonance voltage is on the primary winding, adjusts current in the primary winding to a second value upon ignition of a plasma in the chamber, and raises current in the primary winding to a third value subsequent to switching off of the resonant circuit from the primary winding, thereby controlling ignition of the plasma.

2. The apparatus of claim 1 wherein the resonance voltage is between about one to about ten times higher than voltage supplied by the switching power supply.

3. The apparatus of claim 1 wherein the first value is below a rating of the switching power supply.

4. The apparatus of claim 1 wherein the second value is below a rating of the switching power supply and below a rating of a switching device that switches the resonance capacitor off the primary winding.

5. The apparatus of claim 1 wherein the third value is a steady-state current level in the absence of a resonance voltage on the primary winding.

6. The apparatus of claim 1 wherein the switching power supply comprises a switching semiconductor device directly coupled to a voltage supply.

7. The apparatus of claim 6 wherein the switching semiconductor device comprises a switching transistor.

8. The apparatus of claim 1 further comprising an electrode positioned in the chamber that generates free charges which assist the ignition of a plasma in the chamber.

9. The apparatus of claim 1 further comprising an electrode capacitively coupled to the chamber that generates free charges which assist the ignition of a plasma in the chamber.

10. The apparatus of claim 1 further comprising an ultraviolet light source optically coupled to the chamber that generates free charges which assist the ignition of a plasma in the chamber.

11. A method for dissociating gases in a plasma and controlling plasma ignition, the method comprising:
 a) providing a chamber, and providing a transformer having a primary winding and having a magnetic core surrounding a portion of the chamber;
 b) coupling a resonance capacitor to the primary winding and to a switching power supply, the resonance capacitor and the primary winding of the transformer thereby forming a resonant circuit at switching frequency of the switching power supply;
 c) outputting a resonance voltage on the primary winding with the resonant circuit;
 d) providing an initial ionization event in the chamber to assist ignitions;
 e) maintaining current in the primary winding at a first value while the resonance voltage is on the primary winding and changing current in the primary winding to a second value upon ignition of the plasma;
 f) switching off the resonant circuit from the primary winding subsequent to ignition of the plasma; and thereafter
 g) raising current in the primary winding to a third value.

12. An apparatus for dissociating gases into a plasma, comprising:
 a) a plasma chamber;
 b) a transformer having a primary winding and having a magnetic core surrounding a portion of the chamber;
 c) a switching power supply having a cycle rate, the switching power supply being in electrical communication with the primary winding;
 d) a resonance capacitor in electrical communication with the primary winding and the switching power supply, the resonance capacitor and the switching power supply forming a resonant circuit at a predetermined frequency;
 e) an electronic control circuit in electrical communication with the primary winding and the switching power supply; and
 f) a free charge generator in electric or optical communication with the plasma chamber;
  wherein the control circuit tunes the cycle rate of the switching power to the predetermined frequency so as to raise voltage on the primary winding from an initial voltage supplied by the switching power supply to a resonance voltage, and further wherein the control circuit tunes the cycle rate of the switching power supply away from the predetermined frequency subsequent to ignition of a plasma in the chamber, thereby lowering voltage on the primary winding back to the initial voltage.

13. A method for dissociating gases in a plasma and controlling plasma ignition, the method comprising:
 a) providing a plasma chamber, and providing a transformer having a primary winding and having a magnetic core surrounding a portion of the plasma chamber;
 b) coupling a resonance capacitor to the primary winding and to a switching power supply, the resonance capacitor and the switching power supply thereby forming a resonant circuit at a predetermined frequency;
 c) tuning cycle rate of the switching power supply to the predetermined frequency so as to raise voltage on the primary winding from a first voltage to a resonance voltage, thereby igniting a plasma which completes a secondary circuit of the transformer;
 d) provide an initial ionization event in the plasma chamber to assist ignition; and
 e) tuning cycle rate of the switching power supply away from the predetermined frequency subsequent to ignition of the plasma, thereby lowering voltage on the primary winding to the first voltage.

14. An apparatus for dissociating gases in a plasma comprising:
 a) a plasma chamber;
 b) a transformer having a primary winding and having a magnetic core surrounding a portion of the plasma chamber;
 c) a switching power supply in electrical communication with the primary winding, the plasma chamber and the transformer forming a load on the switching power supply,
  the power supply driving current in the primary winding, the current inducing a potential inside the chamber that forms a plasma which completes a secondary circuit of the transformer; and
 d) an electronic control circuit in electrical communication with the load, the control circuit comprising a current comparator, the control circuit establishing a current set-point for the current in the primary winding; the current comparator measuring current in the primary winding and comparing measured current to the current set-point,
  the current comparator electrically communicating with the switching power supply when measured current reaches the current set-point so as to send the switching power supply into an off state;
  wherein output power of the switching power supply is adjusted based on size of the load.

15. A method for dissociating gases in a plasma and controlling power of plasma sources, the method comprising:
 a) providing a plasma chamber, and providing a transformer having a primary winding and having a magnetic core surrounding a portion of the plasma chamber;
 b) providing a switching power supply in electrical communication with the primary winding, the plasma chamber and the transformer forming a load on the switching power supply;
 c) generating a current driving the primary winding and inducing a potential inside the chamber with the current in the primary winding, the potential forming a plasma which completes a secondary circuit of the transformer;
 d) establishing a current set-point for the current in the primary winding;
 e) measuring current in the primary winding for each duty cycle of the switching power supply, and comparing measured current to the current set-point; and
 f) sending the switching power supply into off state when measured current reaches the current set-point, thereby adjusting average output power of the switching power supply based on size of the load.

16. An apparatus for dissociating gases in a plasma comprising
 a) a plasma chamber;
 b) a transformer having a primary winding and having a magnetic core surrounding a portion of the plasma chamber;
 c) a switching power supply in electric communication with the primary winding, the plasma chamber and the transformer forming a load on the switching power supply;
  the power supply driving current in the primary winding, the current inducing a potential inside the chamber that forms a plasma which completes a secondary circuit of the transformer;
 d) a capacitor connected in parallel with a secondary circuit of the transformer formed by a plasma provided in the plasma chamber; and
 e) an inductor in series with the primary of the transformer;
  wherein the capacitor is in resonance with the effective inductor in LC circuit at the switching frequency of the switching power supply; the effective inductance includes the inductance of the inductor as well as the transformer; and the LC resonant circuit maintains an amplitude of electric current in the plasma that is independent of the plasma load.

17. A method for dissociating gases in a plasma and controlling a constant current in the plasma, the method comprising:
 a) providing a plasma chamber;
 b) providing a transformer having a primary winding and having a magnetic core surrounding a portion of the plasma chamber;
 c) providing a switching power supply in electric communication with the primary winding, the plasma chamber and the transformer forming a load on the switching power supply;
 d) generating a current driving the primary winding and inducing a potential inside the chamber with the current of the primary winding, the potential forming a plasma which completes a secondary circuit of the transformer;
 e) providing a capacitor connected in parallel with a secondary circuit of the transformer formed by a plasma provided in the plasma chamber, and providing an inductor connected in series with the primary of the transformer to form a resonant circuit at the switching frequency of the switching power supply; and
  controlling the current flowing in the plasma by selecting the voltage of the switching power supply and the values of the resonant inductor and capacitor.

18. An apparatus for dissociating gases in a plasma comprising:
 a) a plasma chamber;
 b) a transformer having a primary winding and having a magnetic core surrounding a portion of the plasma chamber; and
 c) a constant-current RF switching power supply in electrical communication with the primary winding, the switching power supply comprising an inductive element connected in series with the plasma chamber and the transformer, the plasma chamber and transformer forming a load on the switching power supply,
  the switching power supply driving current through the inductive element at beginning of each half cycle, without driving current through the load,
  the switching power supply switching current onto the load when current through the inductive element reaches a set-point value, current in the primary winding thereby inducing a potential inside the chamber that forms a plasma which completes a secondary circuit of the transformer,
  the switching power supply switching current off the load at end of each half cycle;
  wherein the inductive element maintains current through the load at about value of initial current through the inductive element, power in the switching power supply thereby being adjusted based on size of the load.

19. A method for dissociating gases in a plasma and controlling power of plasma sources, the method comprising:
 a) providing a plasma chamber, and providing a transformer having a primary winding and having a magnetic core surrounding a portion of the plasma chamber;
 b) providing a constant-current RF switching power supply comprising an inductive element connected in series with the plasma chamber and the transformer;
 c) coupling an output of the constant-current RF switching power supply to the primary winding so that the plasma chamber and the transformer form a load on the constant-current RF switching power supply;
 d) driving current through the inductive element at beginning of each half cycle, without driving current through the load;
 e) switching current onto the load when current through the inductive element reaches a set-point value, current in the primary winding thereby inducing a potential inside the chamber that forms a plasma which completes a secondary circuit of the transformer, and switching current off the load at end of each half cycle; and
 f) maintaining current through the load at about value of initial current through the inductive element, so that power in the constant-current switching power supply is adjusted based on size of the load.

20. An apparatus for dissociating gases comprising:
a) a plasma chamber having a gas inlet, and a plasma channel;
b) a transformer having a primary winding and having a magnetic core surrounding a portion of the plasma chamber;
c) a power supply in electrical communication with the primary winding, the power supply driving current in the primary winding, the current inducing a potential inside the chamber that forms a plasma which completes a secondary circuit of the transformer; and
d) a gas mixing device installed at the gas inlet of the plasma chamber; wherein the gas mixing device injects a feed gas into the plasma chamber, the feed gas thereby mixing and reacting with the plasma in the chamber.

21. The apparatus of claim 20 wherein the gas mixing device is a swirl gas mixer plate.

22. The apparatus of claim 21 wherein the swirl gas mixer plate contains a plurality of openings.

23. The apparatus of claim 22 wherein the plurality of openings are at about thirty to about sixty degrees relative to an axis of the plasma channel.

24. The apparatus of claim 21 wherein the swirl gas mixer plate injects the feed gas helically into the plasma chamber so as to create a spiral flow.

25. A method for reducing the electric field required to operate a toroidal plasma source, the method comprising:
a) providing a plasma chamber in which a cross-section area of the plasma channel is substantially between about 2 cm$^2$ and about 20 cm$^2$;
b) providing a transformer having a primary winding and having a magnetic core surrounding a portion of the plasma chamber;
c) igniting a plasma in a noble gas environment; and
d) mixing at least one reactant gas into the noble gas environment thereby forming a gas mixture and feeding the gas mixture into the plasma chamber after the plasma has been ignited; wherein a fractional concentration of the noble gas in the gas mixture is adjusted to achieve a desired plasma impedance.

26. A method for dissociating gases into a plasma comprising:
a) providing a chamber for containing a gas at a pressure;
b) reducing pressure of the chamber to from about 0.1 torr to about 200 torr;
c) providing a transformer having a primary winding and having a magnetic core surrounding a portion of the chamber;
d) generating a current driving the primary winding with a power supply;
e) inducing a potential inside the chamber with the current in the primary winding, the potential forming a plasma which completes a secondary circuit of the transformer; and
f) introducing a reactant gas into the chamber subsequent to formation of the plasma, and thereafter adjusting pressure in the chamber to a predetermined level.

27. The method of claim 26 wherein the predetermined level is from about one millitorr to about 1.5 atmosphere.

28. The method of claim 26 wherein the gas at a pressure comprises a noble gas.

29. The method of claim 26 wherein the gas at a pressure comprises a reactant gas.

30. The method of claim 26 wherein the gas at a pressure comprises a mixture of at least one noble gas and at least one reactant gas.

31. A method processing materials with a reactive gas generated by a plasma source, the method comprising:
a) providing a plasma chamber for containing a gas at a pressure;
b) adding a noble carrier gas to a reactant gas, and introducing resulting gas mixture into the plasma chamber;
c) providing a transformer having a primary winding and having a magnetic core surrounding a portion of the plasma chamber;
d) generating a current driving the primary winding with a power supply;
e) inducing a potential inside the chamber with the current driving the primary winding, the potential forming a plasma which completes a secondary circuit of the transformer;
f) generating a reactive gas in the plasma;
g) providing a process chamber containing a material to be processed; and
h) transporting the reactive gas from the plasma chamber into the process chamber, thereby processing the material.

32. The method of claim 31 wherein the carrier gas comprises a noble gas.

33. The method of claim 31 wherein the reactive gas comprises atomic fluorine, atomic chlorine, atomic bromine and atomic oxygen.

34. The method of claim 31 wherein the reactive gas comprises atomic hydrogen, atomic nitrogen, or a mixture of atomic hydrogen and atomic nitrogen.

35. The method of claim 31 wherein flow rate of the noble carrier gas is substantially between 1 and 50 standard liters per minute.

36. The method of claim 31 wherein the process chamber is located downstream of the plasma chamber.

* * * * *